United States Patent
Lin et al.

(10) Patent No.: US 11,210,447 B2
(45) Date of Patent: Dec. 28, 2021

(54) RECONFIGURING LAYOUT AND SIZING FOR TRANSISTOR COMPONENTS TO SIMULTANEOUSLY OPTIMIZE LOGIC DEVICES AND NON-LOGIC DEVICES

(71) Applicant: Taiwan Semiconductor Manufacturing Co., Ltd., Hsinchu (TW)

(72) Inventors: Jiefeng Jeff Lin, Hsinchu (TW); Chih-Yung Lin, Hsinchu County (TW); Dian-Sheg Yu, Hsinchu (TW); Hsiao-Lan Yang, Taipei (TW); Jhon Jhy Liaw, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 52 days.

(21) Appl. No.: 16/414,488

(22) Filed: May 16, 2019

(65) Prior Publication Data
US 2020/0097632 A1    Mar. 26, 2020

Related U.S. Application Data

(60) Provisional application No. 62/736,493, filed on Sep. 26, 2018.

(51) Int. Cl.
*H01L 27/088* (2006.01)
*G06F 30/398* (2020.01)
(Continued)

(52) U.S. Cl.
CPC .... *G06F 30/398* (2020.01); *H01L 21/823431* (2013.01); *H01L 21/823437* (2013.01);
(Continued)

(58) Field of Classification Search
CPC ..... H01L 21/823475; H01L 21/823431; H01L 21/76897; H01L 21/76877; H01L 29/7855;
(Continued)

(56) References Cited

U.S. PATENT DOCUMENTS 7,667,271 B2    2/2010  Yu et al.
7,910,453 B2    3/2011  Xu et al.
(Continued)

FOREIGN PATENT DOCUMENTS

CN    106952908 A    7/2017
CN    107230677 A    10/2017
(Continued)

*Primary Examiner* — Khiem D Nguyen

(57) ABSTRACT

The first type of semiconductor device includes a first fin structure extending in a first direction, a first gate, and a first slot contact disposed over the first fin structure. The first gate extends in a second direction and has a first gate dimension measured in the first direction. The first slot contact has a first slot contact dimension measured in the first direction. A second type of semiconductor device includes: a second fin structure extending in a third direction, a second gate, and a second slot contact disposed over the second fin structure. The second gate extends in a fourth direction and has a second gate dimension measured in the third direction. The second slot contact has a second slot contact dimension measured in the third direction. The second slot contact dimension is greater than the second gate dimension and greater than the first slot contact dimension.

20 Claims, 25 Drawing Sheets

(51) Int. Cl.
*H01L 29/78* (2006.01)
*H01L 21/8234* (2006.01)
*H01L 23/522* (2006.01)

(52) U.S. Cl.
CPC .. *H01L 21/823475* (2013.01); *H01L 23/5226* (2013.01); *H01L 27/0886* (2013.01); *H01L 29/785* (2013.01); *H01L 2029/7858* (2013.01)

(58) Field of Classification Search
CPC ............. H01L 29/785; H01L 29/41791; H01L 29/66795; H01L 27/0886; H01L 23/5226; H01L 23/5283; H01L 21/8238; H01L 21/823821; H01L 21/823814; H01L 21/823437; G06F 30/398
See application file for complete search history.

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,755,030 B2* | 9/2017 | Radens | H01L 29/0649 |
| 10,050,149 B1* | 8/2018 | Huang | H01L 27/0886 |
| 10,522,392 B2* | 12/2019 | You | H01L 21/76834 |
| 2013/0264639 A1* | 10/2013 | Glass | H01L 29/086 257/335 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0159158 A1* | 6/2014 | Kim | H01L 21/76895 257/368 |
| 2014/0245248 A1* | 8/2014 | Yang | G06F 30/392 716/122 |
| 2014/0319623 A1* | 10/2014 | Tsai | H01L 29/40114 257/401 |
| 2015/0187767 A1 | 7/2015 | Grisham et al. | |
| 2016/0133522 A1* | 5/2016 | Kang | H01L 21/76816 438/283 |
| 2016/0181399 A1* | 6/2016 | Jun | H01L 29/165 438/294 |
| 2017/0352658 A1* | 12/2017 | Zhang | H01L 21/76831 |
| 2017/0365555 A1 | 12/2017 | Choi et al. | |
| 2017/0373189 A1* | 12/2017 | Lee | H01L 21/823821 |
| 2018/0053084 A1* | 2/2018 | Li | G06N 3/063 |
| 2019/0080998 A1* | 3/2019 | Rastogi | H01L 27/0924 |

FOREIGN PATENT DOCUMENTS

| | | |
|---|---|---|
| JP | 2017-0187767 | 10/2017 |
| KR | 20140074673 A | 6/2014 |
| KR | 20170112912 | 10/2017 |
| TW | 201730919 A | 9/2017 |
| TW | 201824447 A | 7/2018 |
| TW | 201826354 A | 7/2018 |

\* cited by examiner

RECONFIGURING LAYOUT AND SIZING FOR TRANSISTOR COMPONENTS TO SIMULTANEOUSLY OPTIMIZE LOGIC DEVICES AND NON-LOGIC DEVICES

PRIORITY DATA

The present application is a utility application of Provisional U.S. Pat. App. No. 62/736,493, filed on Sep. 26, 2018, entitled "Improved Layout Design for High Speed Transistors", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. However, conventional transistor layout design has not been optimized for high speed IC applications, where parasitic capacitance and/or resistance could significantly degrade device performance.

Therefore, although existing semiconductor IC devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
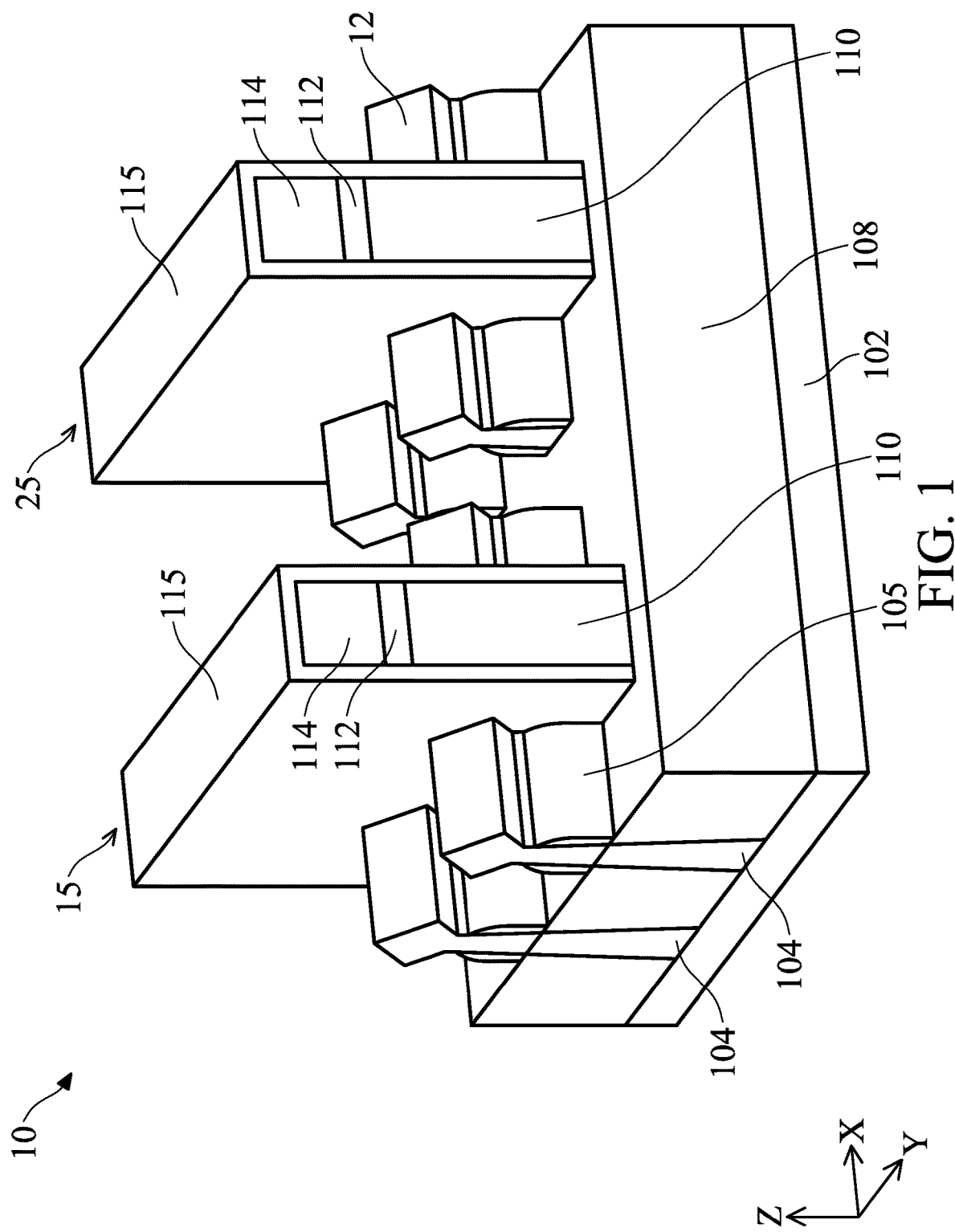
FIG. 1 illustrates a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As semiconductor device sizes continue to get scaled down, parasitic capacitance and/or resistance could play a more significant role in affecting a semiconductor device's performance, particularly for high speed applications such as Serializer/De-serializer devices or radio frequency (RF) devices. However, conventional semiconductor device layout design has mostly focused on optimizing the performance of non-high-speed applications, such as logic devices. As such, a layout design that is otherwise suitable for non-high-speed applications may lead to excessive parasitic capacitance and/or resistance for high speed devices, which could adversely affect the performance of the high speed devices.

To overcome the problems discussed above, the present disclosure pertains to novel and non-obvious layout schemes resize or relocate the various components of a semiconductor device, including but not limited to conductive contacts, vias, or metal lines, as discussed below in more detail.

It is understood that embodiments of the present disclosure may apply to a plurality of types of ICs and/or transistors. For example, the present disclosure may apply to planar devices, a fin-like field-effect transistor (FinFET) devices (which may be a two-dimensional structure or a three-dimensional structure), vertical gate-all-around (GAA) devices, horizontal GAA devices, nano-wire devices, nano-sheet devices, or combinations thereof. For the sake of providing an example, an example FinFET device is illustrated in FIG. 1. However, it is understood that the application should not be limited to a particular type of device, except as specifically claimed.

Referring to FIG. 1, a perspective view of an example FinFET device 10 is illustrated. The FinFET device 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epitaxially-grown material 12, which may (along with portions of the fin structure 104) serve as the source/drain of the FinFET device structure 10. In some embodiments, for an NFET, the epitaxially-grown material may include SiP, SiC, SiPC, SiAs, Si, or combinations thereof. In some embodiments, for a PFET, the epitaxially-grown material may include SiGe, SiGeC, Ge, Si, a boron-doped material, or combinations thereof.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. Various aspects of the present disclosure are discussed below using ICs that are implemented using FinFET devices. However, it is understood that this is merely for the purposes of providing an example, and that the present disclosure is not limited to FinFET devices and may apply to planar devices, GAA devices, nano-wire devices, or nano-sheet devices, etc.

Figure 2:
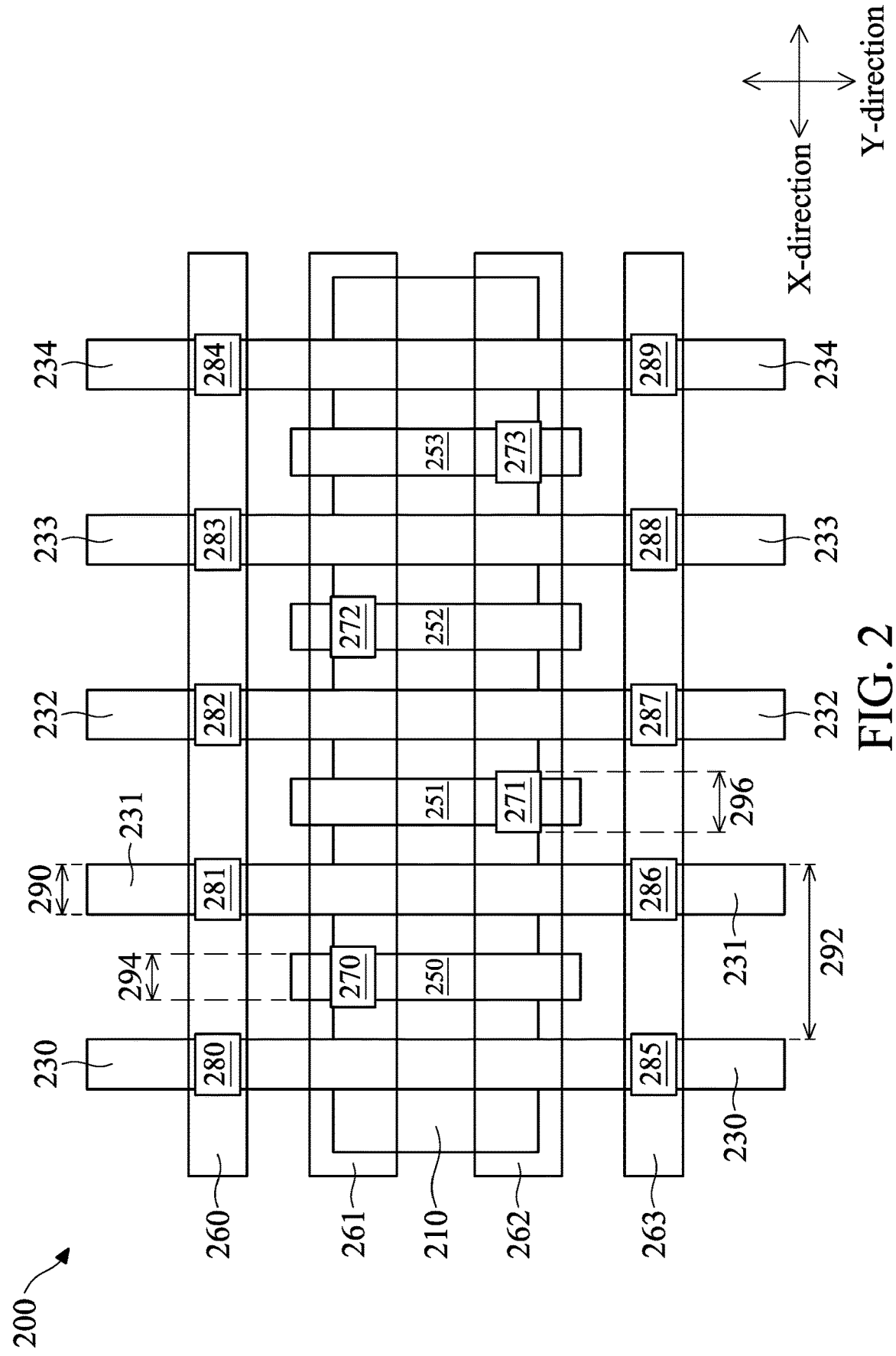
FIGS. 2, 3A-3B, 4A-4B, 5A-5B, 6A-6B, 7A-7B, and 8A-8B illustrate top views of a portion of a semiconductor device according to embodiments of the present disclosure.

FIG. 2 illustrates a top view of a semiconductor device 200 according to an embodiment of the present disclosure. The semiconductor device 200 may be implemented as FinFET transistors in some embodiments. The semiconductor device 200 may represent (or include) a logic device, for example a circuit that includes NOR gates, NAND gates, XOR gates, inverter gates, etc. Alternatively, the semiconductor device 200 may also represent (or include) non-logic devices such as high speed devices, that have not been optimized by the various aspects of the present disclosure. This is because conventional IC layout design does not differentiate between logic devices and non-logic devices. As such, from a layout perspective, logic devices and non-logic devices may appear substantially the same. However, this is not the case according to the present disclosure, as will become more apparent based on the discussions below.

The semiconductor device 200 includes a fin structure 210. The fin structure 210 may also be referred to as an active region. The fin structure 210 may be implemented as an embodiment of the fin structure 104 of FIG. 1. The fin structure 210 may also include epitaxially grown layers. The channel region and the source/drain regions of FinFET devices are formed by different portions of the fin structure 210. As shown in FIG. 2, the fin structure 210 is elongated and extends in the X-direction (the same X-direction as in FIG. 1).

The semiconductor device 200 includes a plurality of gate structures 230-234 that each partially wraps around the fin structure 210. The gate structures 230-234 may each include a high-k gate dielectric and a metal gate electrode, for example the gate electrode 110 of FIG. 1. The manner in which the gate structures 230-234 wrap around the fin structure 210 is similar to how the gate electrode 110 wraps around the fin structure 104 in FIG. 1. As shown in FIG. 2, the gate structures 230 are each elongated and extend in the Y-direction (the same Y-direction as in FIG. 1) that is perpendicular to the X-direction.

The semiconductor device 200 includes a plurality of slot contacts 250-253. The slot contacts 250-253 each include one or more electrically conductive layers. For example, the electrically conductive layers may include Ti, TiN, Pt, Co, Ru, W, TaN, Cu, or combinations thereof. The slot contacts 250-253 each extend in an elongated manner in the Y-direction. Also as shown in FIG. 2, the slot contacts 250-253 intersect with different portions of the fin structure 210 (or the epi-layers formed thereon). The portions of the fin structure 210 (or the epi-layers formed thereon) being intersected may be the source/drain regions of the FinFET devices, and thus the slot contacts 250-253 are capable of providing electrical connectivity to the source/drain regions.

The semiconductor device 200 also includes a plurality of metal lines 260-263. The metal lines 260-263 are located over the fin structure 210 and the gate structures 230-234 and are part of a multi-layered interconnect structure that contains metal lines and vias to electrically interconnect various components of an IC. The metal lines 260-263 may be implemented in the bottom interconnect layer—referred to as a M0 (or metal-0) layer—of the multi-layered interconnect structure. The metal lines 260-263 may each extend in an elongated manner in the X-direction.

The semiconductor device 200 includes a plurality of source/drain vias 270-273. The source/drain vias 270-273 are disposed vertically (e.g., in the Z-direction of FIG. 1) between the slot contacts 250-253 and the metal lines 261-262. For example, the source/drain via 270 is disposed between the slot contact 250 and the metal line 261, the source/drain via 271 is disposed between the slot contact 251 and the metal line 262, the source/drain via 272 is disposed between the slot contact 252 and the metal line 261, and the source/drain via 273 is disposed between the slot contact 253 and the metal line 262. As such, the slot contacts 250-253, the metal lines 261-262, and the source/drain vias 270-273 collectively provide electrical connectivity to the source/drain regions of the FinFET devices.

The semiconductor device 200 includes a plurality of gate contacts 280-289. The gate contacts 280-289 are disposed vertically (e.g., in the Z-direction of FIG. 1) between the gate structures 230-234 and the metal lines 260 and 263. For example, the gate contacts 280-284 are disposed between the metal line 260 and the gate structures 230-234, and the gate contacts 285-289 are disposed between the metal line 263 and the gate structures 230-234. As such, the metal lines 260, 263, and the gate contacts 280-289 collectively provide electrical connectivity to the gates of the FinFET devices.

The dimensions of the various components discussed above are optimized for logic devices. For example, the gate structures 230-234 may each have a minimum gate length 290 that is measured in the X-direction. The minimum gate length 290 may also be referred to as a critical dimension (CD) of the semiconductor device 200. A contacted gate pitch (CPP) 292 is measured as a distance between adjacent ones of the gate structures 230-234 (for example between the gate structures 230-231). The minimum gate length 290 and the CPP 292 for logic devices are designed to be tight for power-performance-area (PPA) considerations. In some embodiments, a ratio of the CPP 292 and the minimum gate length 290 may be in a range between about 2:1 and about 4:1.

The slot contacts 250-253 may each have a dimension 294 that is also measured laterally in the X-direction. To optimize the performance of the logic devices of the semiconductor device 200, the dimension 294 may be substantially similar to the minimum gate length 290 in value. For example, a ratio of the dimension 294 and the minimum gate length 290 may be in a range between about 0.8:1 and about 1.3:1.

The source/drain vias 270-273 may each have a dimension 296 measured in the X-direction. To optimize the performance of the logic devices of the semiconductor device 200, the dimension 296 may be comparable to the dimension 294. For example, a ratio of the dimension 296 and the dimension 294 may be in a range between about 0.7:1 and about 1.3:1.

However, although the sizing of the various components of the semiconductor device 200 optimizes the performance of the logic devices, they may not be ideal for other types of devices on an IC, for example transistors in high-speed applications. In some embodiments, a high-speed device may be a device operating at a data rate greater than 10 giga-bit per second (Gbps), and as non-limiting examples may include a Serializer/Deserializer device or a radio frequency (RF) device.

The transistors in high speed applications may be more sensitive to parasitic capacitance and/or parasitic resistance. Unfortunately, the device sizing scheme used for logic devices such as the ones in the semiconductor device 200 may increase parasitic capacitance and/or parasitic resistance, which renders such a device sizing scheme less than optimal for non-logic devices such as high-speed devices. To overcome this issue, the present disclosure uses a different sizing scheme for non-logic devices (e.g., high-speed devices). It is understood that the non-logic devices may be implemented on the same chip as the logic devices of the semiconductor device 200.

Figure 3A:
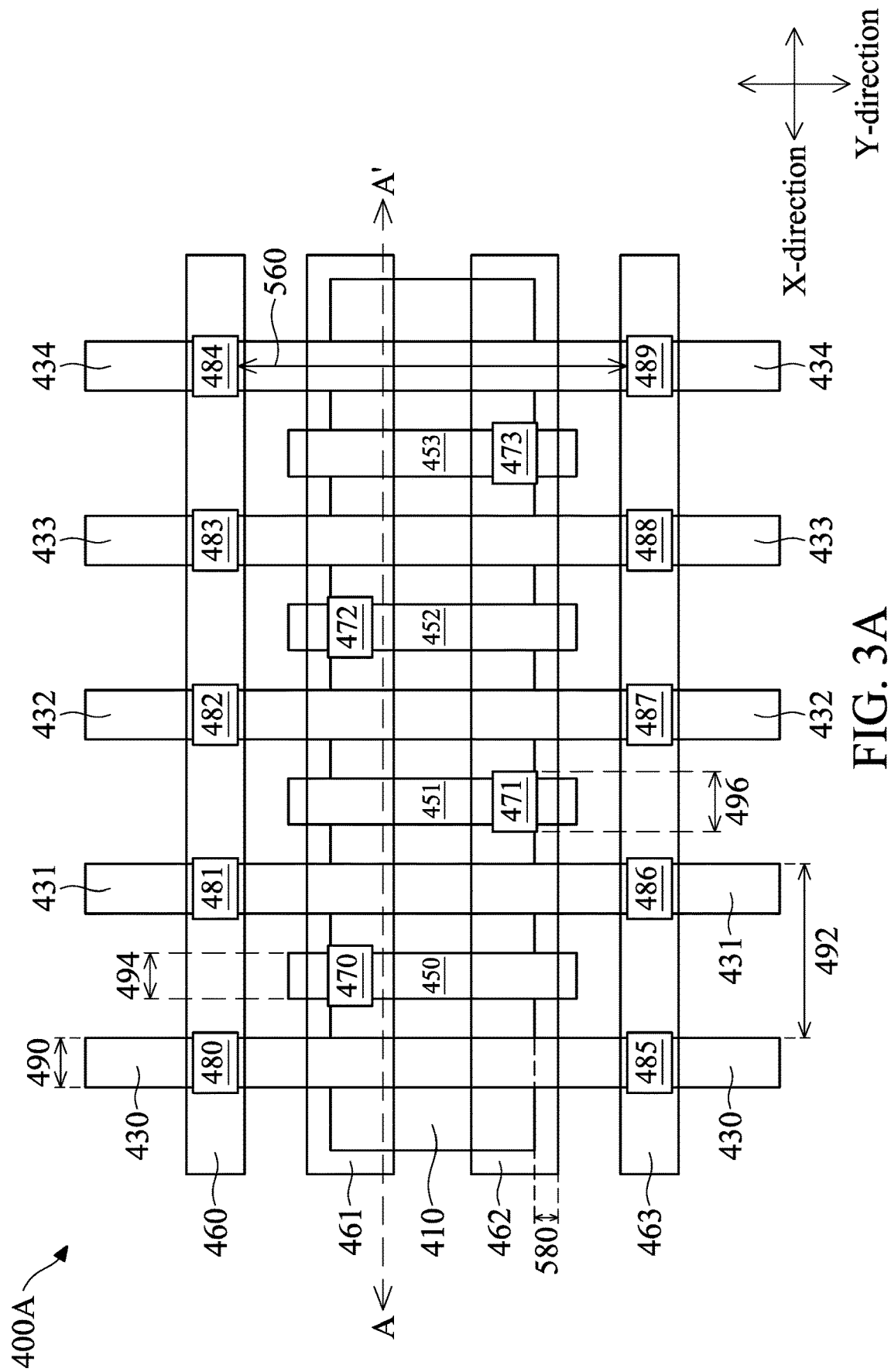
Figure 3B:
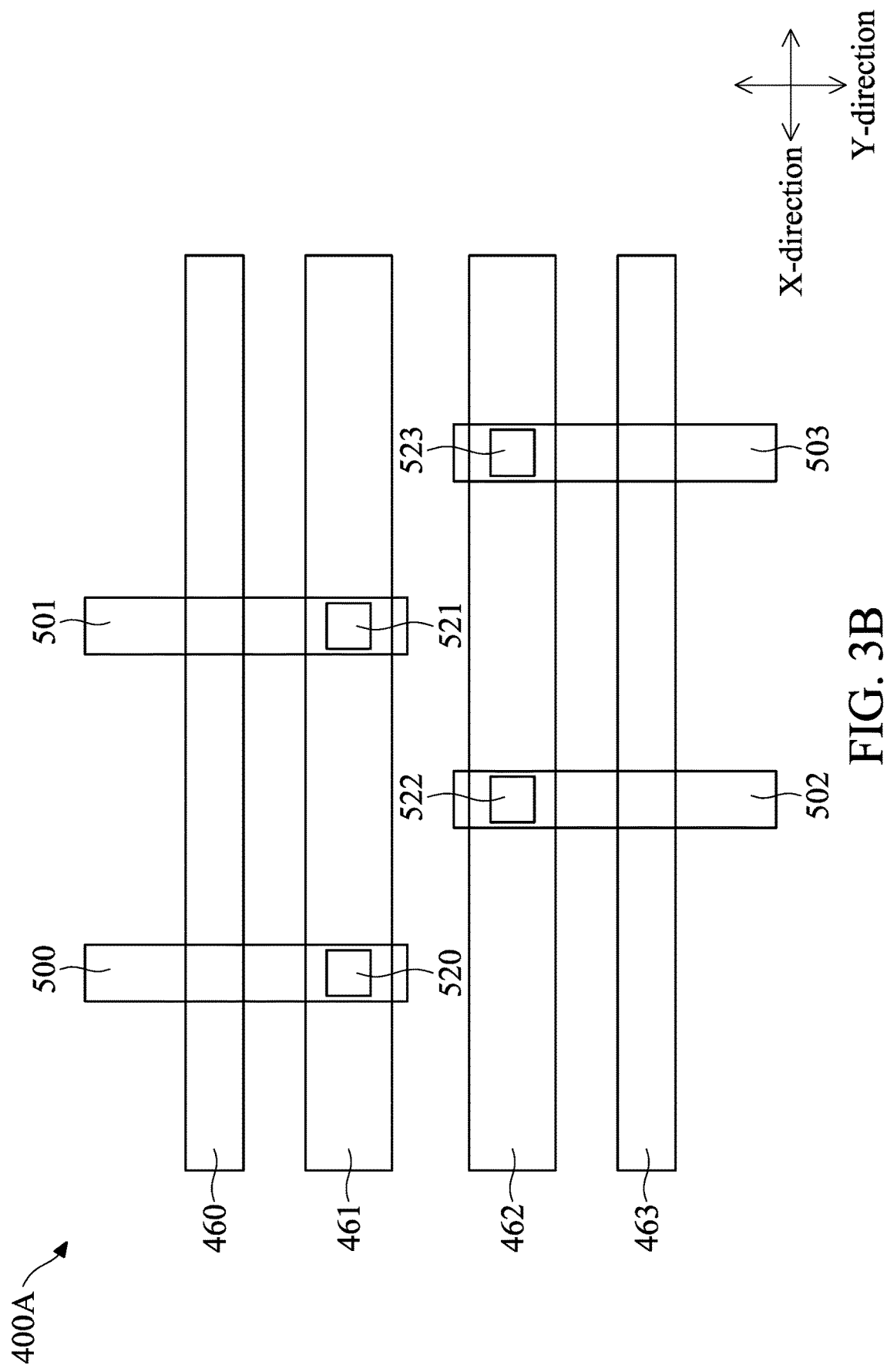
Figure 3C:
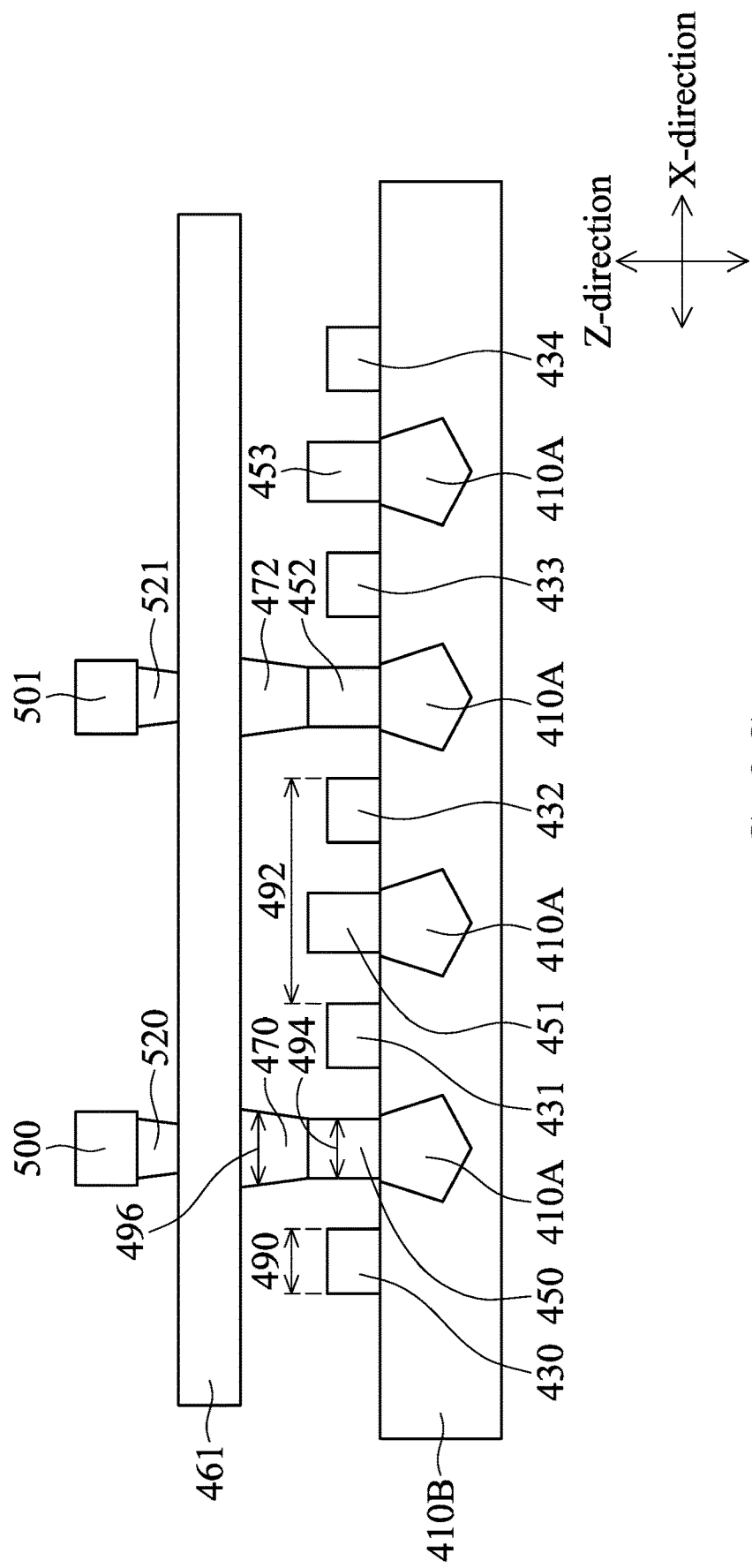
FIGS. 3C, 4C, 5C, 6C-6D, 7C-7D, and 8C-8D illustrate cross-sectional side views of a portion of a semiconductor device according to embodiments of the present disclosure.

One example sizing scheme is illustrated in FIGS. 3A, 3B, and 3C. In that regard, FIGS. 3A-3B illustrate different top views of a semiconductor device 400A that is a non-logic device (e.g., a high-speed device), and FIG. 3C illustrates a cross-sectional side view of the semiconductor device 400A, where the cross-section is taken along a cutline A-A' of FIG. 3A. Since the cutline A-A' spans along the X-direction, FIG. 3C may also be referred to as an X-cut. In some embodiments, the semiconductor device 200 and the semiconductor device 400A may be fabricated on the same IC (but in different portions or regions of the IC). It is understood, however, that the X-direction shown in FIG. 2 for the semiconductor device 200 may be the same as, or different than, the X-direction shown in FIGS. 3A-3C for the semiconductor device 400A. The same may be true for the Y-direction.

Referring now to FIG. 3A and FIG. 3C, the semiconductor device 400A may include a fin structure 410 that is similar to the fin structure 210 of FIG. 2, a plurality of gate structures 430-434 that are similar to the gate structures 230-234 of FIG. 2, a plurality of slot contacts 450-453 that are similar to the slot contacts 250-253 of FIG. 2, a plurality of metal lines 460-463 that are similar to the metal lines 260-263 of FIG. 2, a plurality of source/drain vias 470-473 that are similar to the source/drain vias 270-273 of FIG. 2, and a plurality of gate contacts 480-489 that are similar to the gate contacts 280-289 of FIG. 2. As shown in the cross-section view of FIG. 3C, the fin structure 410 may include a crystal semiconductor fin portion 410B and epi-layer portions 410A that are grown epitaxially on the semiconductor fin portion 410B. The similarity between these components may refer to their methods/processes of fabrication, material compositions, functionalities, or even certain layout arrangements etc. However, unlike the components of the semiconductor device 200, the components of the semiconductor device 400A may have different sizing schemes in order to minimize parasitic capacitance and/or resistance.

In more detail, the gate structures 430-434 may each have a minimum gate length 490 measured in the X-direction. The minimum gate length 490 is substantially equal in value to the minimum gate length 290 of FIG. 2. In other words, the gate structures 230-234 and the gate structures 430-434 are substantially similar to one another in terms of their sizes. In some embodiments, a ratio of the minimum gate length 490 and the minimum gate length 290 may be in a range from about 1.1:1 and about 0.9:1.

Still referring to FIGS. 3A and 3C, compared to the semiconductor device 200, the semiconductor device 400A has a substantially larger CPP 492. In some embodiments, a ratio of the CPP 492 and the CPP 292 is in a range between about 1.1:1 and about 2:1. The enlarged CPP 492 also changes its ratio with the minimum gate length 490. In some embodiments, a ratio of the CPP 492 and the gate length 490 is in a range between about 4:1 and about 8:1. The enlarging of the CPP effectively increases a distance between two conductive plates of a parasitic capacitor (e.g., the two adjacent gate structures may be the conductive plates). Since capacitance is inversely correlated with the distance between two conductive plates, the enlarging of the CPP 492 reduces parasitic capacitance of the semiconductor device 400A, which in turn improves its performance such as speed.

The enlarging of the CPP 492 also provides more room for the expansion of the slot contacts 450-453. As shown in FIGS. 3A and 3C, the slot contacts 450-453 may each have a dimension 494 measured in the X-direction. Compared to the dimension 294 shown in FIG. 2, the dimension 494 is substantially greater. In some embodiments, a ratio of the dimension 494 and the dimension 294 is in a range between about 1.5:1 and about 3:1.

The expansion or enlargement of the slot contacts 450-453 may also be reflected in terms of its size relative with the source/drain vias disposed thereon. For example, the source/drain vias 470-473 may each have a lateral dimension 496 measured in the X-direction. Whereas the source/drain vias 270-273 may each be substantially greater in size than each of the slot contacts 250-253, the source/drain vias 470-473 may each be no greater than each of the slot contacts 450-453 in size, for example they may be approximately equal to or smaller than each of the slot contacts 450-453. In some embodiments, a ratio of the dimension 496 and the dimension 494 is in a range between about 1:1 and about 0.8:1.

The enlarging of the slot contacts 450-453 effectively increases the interface surface area between the slot contacts 450-453 and the source/drain vias 470-473. A parasitic resistance may be generated due to the interface between the slot contacts 450-453 and the source/drain vias 470-473. Since resistance is inversely correlated with the size of the interface surface area, the enlarging of the slot contacts 450-453 reduces parasitic resistance of the semiconductor device 400A, which in turn improves its performance such as speed.

As discussed above, the metal lines 460-463 belong to a metal-0 layer of a multi-layered interconnect structure. FIG. 3B illustrates the top view of another metal layer of the multi-layered interconnect structure: the metal-1 layer that is located above the metal-0 layer. For example, FIG. 3B illustrates metal lines 500-503 of the metal-1 layer. The metal lines 500-503 each extend in an elongated manner in the Y-direction (e.g., perpendicular to the metal lines 460-463). The metal lines 460-463 are also illustrated in FIG. 3B for the sake of clarity. The metal lines 500-501 overlap or intersect with the metal lines 460-461 in the top view, and the metal lines 502-503 overlap or intersect with the metal lines 462-463 in the top view. The metal lines 500-503 may also include a conductive material similar to the metal lines 460-463, for example materials that contain copper, aluminum, titanium, tungsten, etc.

A plurality of vias 520-523 are disposed between the metal-0 and metal-1 layer to electrically interconnect them together. In more detail, the via 520 is disposed between the metal lines 461 and 500, the via 521 is disposed between the metal lines 461 and 501, the via 522 is disposed between the metal lines 462 and 502, and the via 523 is disposed between the metal lines 462 and 503.

Figure 4A:
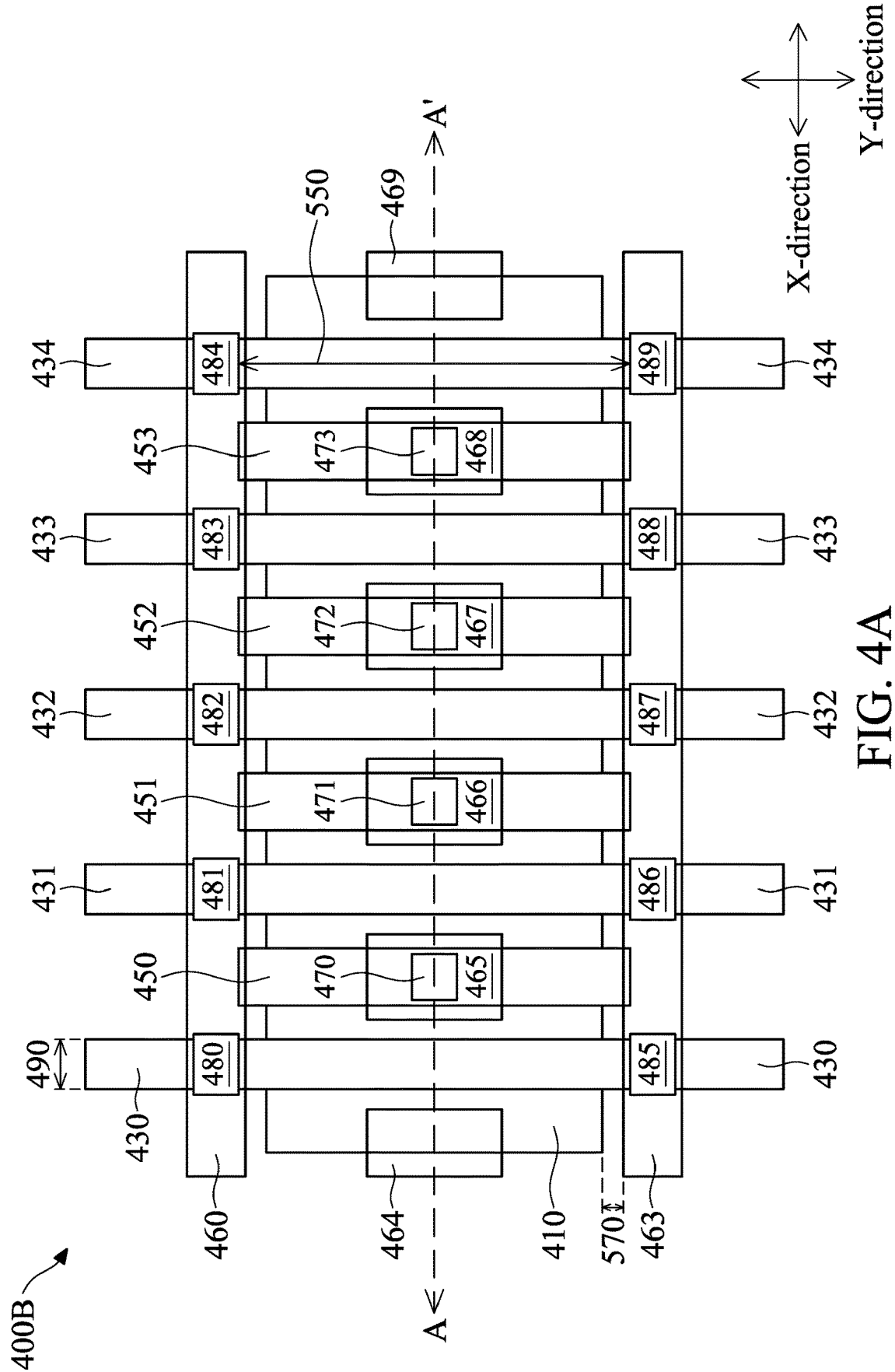
Figure 4B:
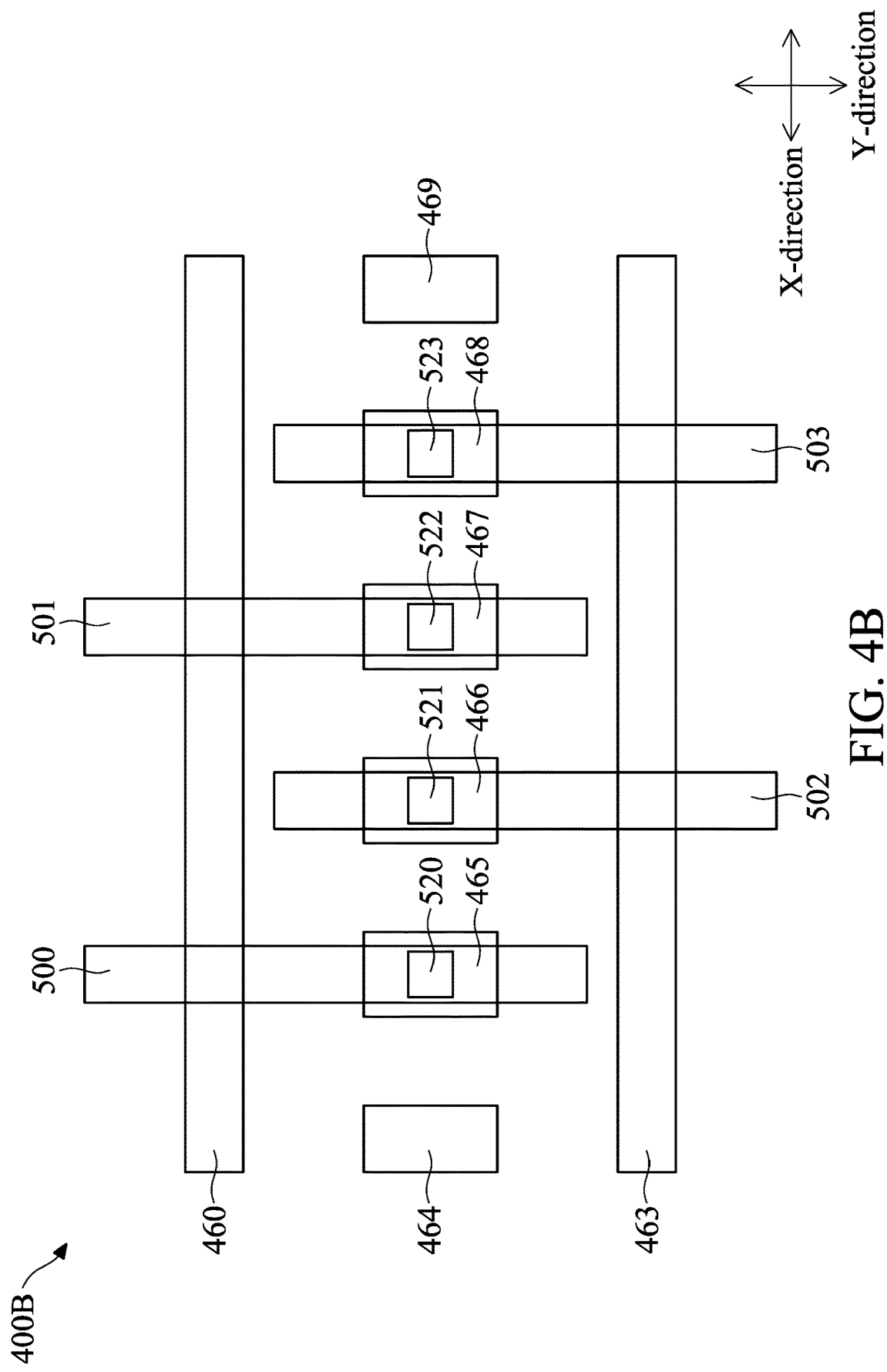
Figure 4C:
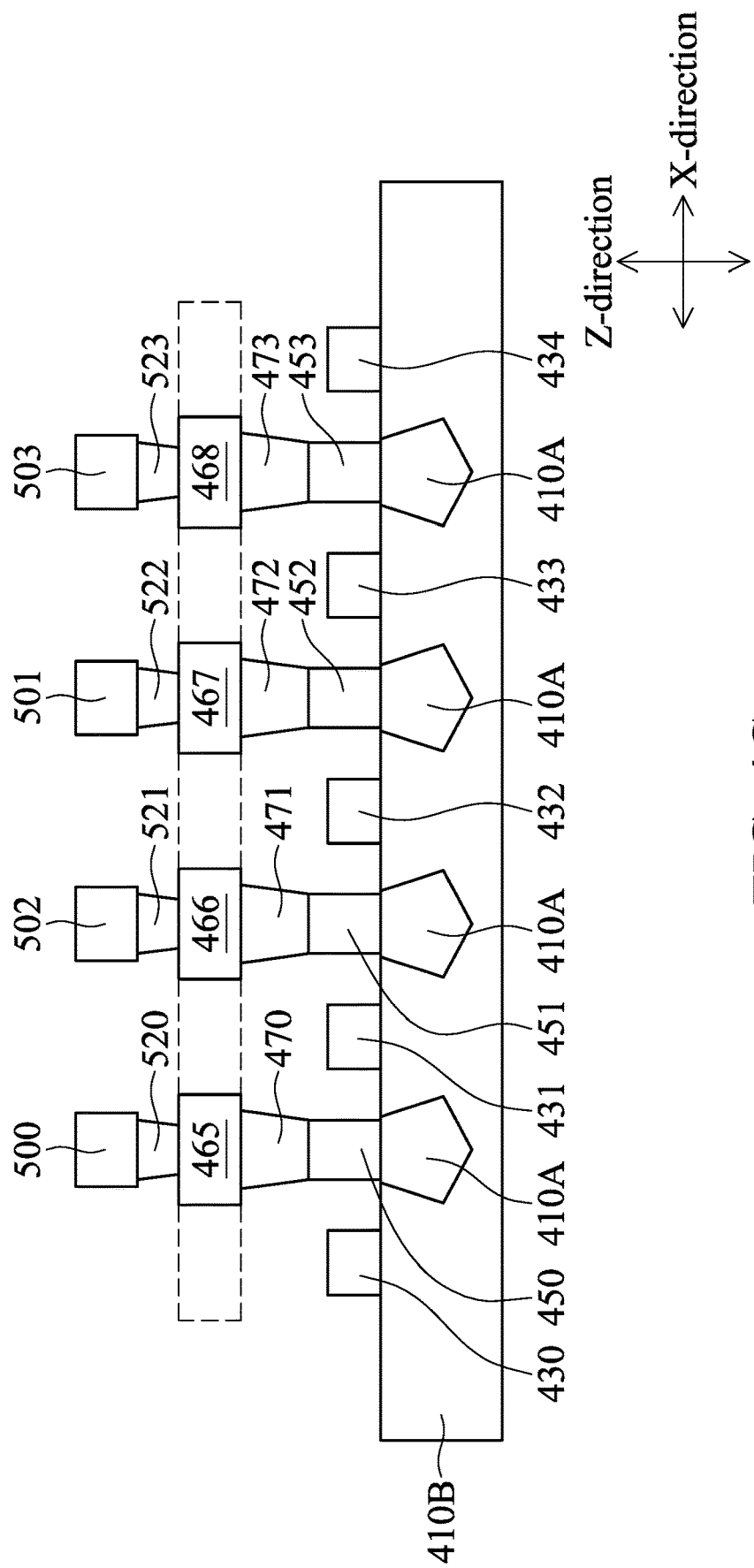

FIGS. 4A, 4B, and 4C illustrate another embodiment of the present disclosure. In more detail, similar to FIGS. 3A-3B, FIGS. 4A-4B illustrate the top views of a semiconductor device 400B at different levels. And similar to FIG. 3C, FIG. 4C illustrates the cross-sectional side view of the semiconductor device 400B where the cross-section is taken along the cutline A-A', although the location of the cutline A-A' in FIG. 4A is different from the location of the cutline A-A' in FIG. 3A. For reasons of consistency and clarity, similar components appearing in FIGS. 3A-3C and FIGS. 4A-4C are labeled the same, and their details are not repeated herein. It is also understood that the device sizing of the semiconductor device 400B may be similar to that of the semiconductor device 400A (unless specifically described otherwise). As such, the semiconductor device 400B achieves similar benefits offered by the semiconductor device 400A, such as reduced parasitic resistance and/or parasitic capacitance, which in turn improves device performance such as speed.

One difference between the semiconductor device 400A and the semiconductor device 400B is that, rather than implementing two metal lines 461-462 over the slot contacts 450-453 (see FIG. 3A), the semiconductor device 400B implements a plurality of metal "islands" 464-469 over the slot contacts 450-453. These metal islands 464-469 may still be formed in the metal-0 layer and may be formed using similar fabrication processes to form the metal lines 461-462, though they are patterned differently. The dashed boxes shown in FIG. 4C represent the portions of the metal line 461 (see FIG. 3C) that are "missing" due to the implementation of the metal islands 465-468. As shown clearly in FIG. 4C, the metal island 465 is disposed between the vias 470 and 520, the metal island 466 is disposed between the vias 471 and 521, the metal island 467 is disposed between the vias 472 and 522, and the metal island 468 is disposed between the vias 473 and 523.

The implementation of the metal islands 464-469 allows the vias 470-473 to be more "centered" compared to the semiconductor device 400A. For example, in the semiconductor device 400A shown in FIG. 3A, the vias 470 and 472 are disposed such that they intersect with the metal line 461 in the top view, whereas the vias 471 and 473 are disposed such that they intersect with the metal line 462 in the top view. As a result, the vias 470 and 472 are not aligned with the vias 471 and 473. In comparison, the vias 470-473 in the semiconductor device 400B are substantially aligned in the X-direction. The fact that each of the vias 470-473 may be electrically routed to a respective one of the metal lines 500-503 through a respective one of the metal islands 465-468 means that the source/drain regions (e.g., the epi-layers 410A) have a more direct and shorter electrical route to the metal lines 500-503. This helps to reduce resistance (e.g., parasitic source/drain resistance) and in turn improves the performance of the semiconductor device 400B such as speed.

Another benefit offered by the semiconductor device 400B is that the gate contacts 480-484 are now located closer to the gate contacts 485-489. As shown in FIG. 4A, a distance 550 separates the gate contact 484 from the closest gate contact 489 in the Y-direction. Note that the same distance 550 separate the other pairs of gate contacts 480/485, 481/486, 482/487, and 483/488.

In comparison, a greater distance 560 separates the gate contact 484 from the closest gate contact 489 in the Y-direction for the semiconductor device 400A in FIG. 3A. The shortening of the gate-contact-to-gate-contact distance (i.e., the smaller distance 550 VS the greater distance 560) leads to a reduction in parasitic gate resistance, which in turn improves the performance of the semiconductor device 400B such as speed.

Another difference between the semiconductor devices 400A and 400B is the amount of "active fin extension" associated with the slot contact. For example, as shown in FIG. 4A, the slot contact 450 (as an example one of the slot contacts 450-453) extends beyond the fin structure 410 in the Y-direction by a distance 570. In comparison, for the semiconductor device 400A shown in FIG. 3A, the slot contact 450 extends beyond the fin structure 410 in the Y-direction by a distance 580 that is substantially greater than the distance 570. The distance 570 or 580 may be considered the "active fin extension" associated with the slot contacts 450-453, and they contribute to parasitic capacitance. Since the "active fin extension" is shortened in the semiconductor device 400B, the parasitic capacitance is also reduced, which again improves the performance of the semiconductor device 400B.

Figure 5A:
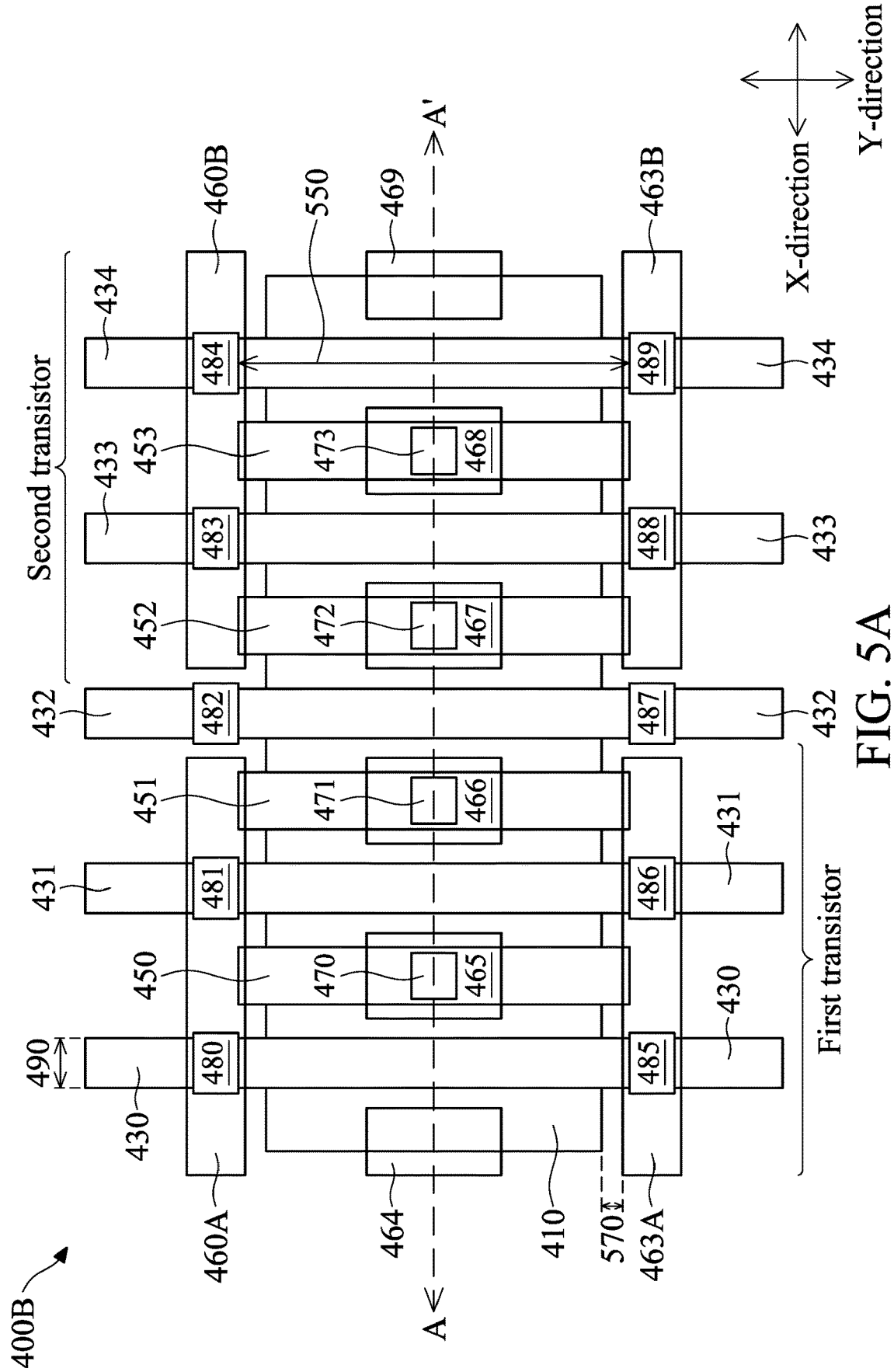
Figure 5B:
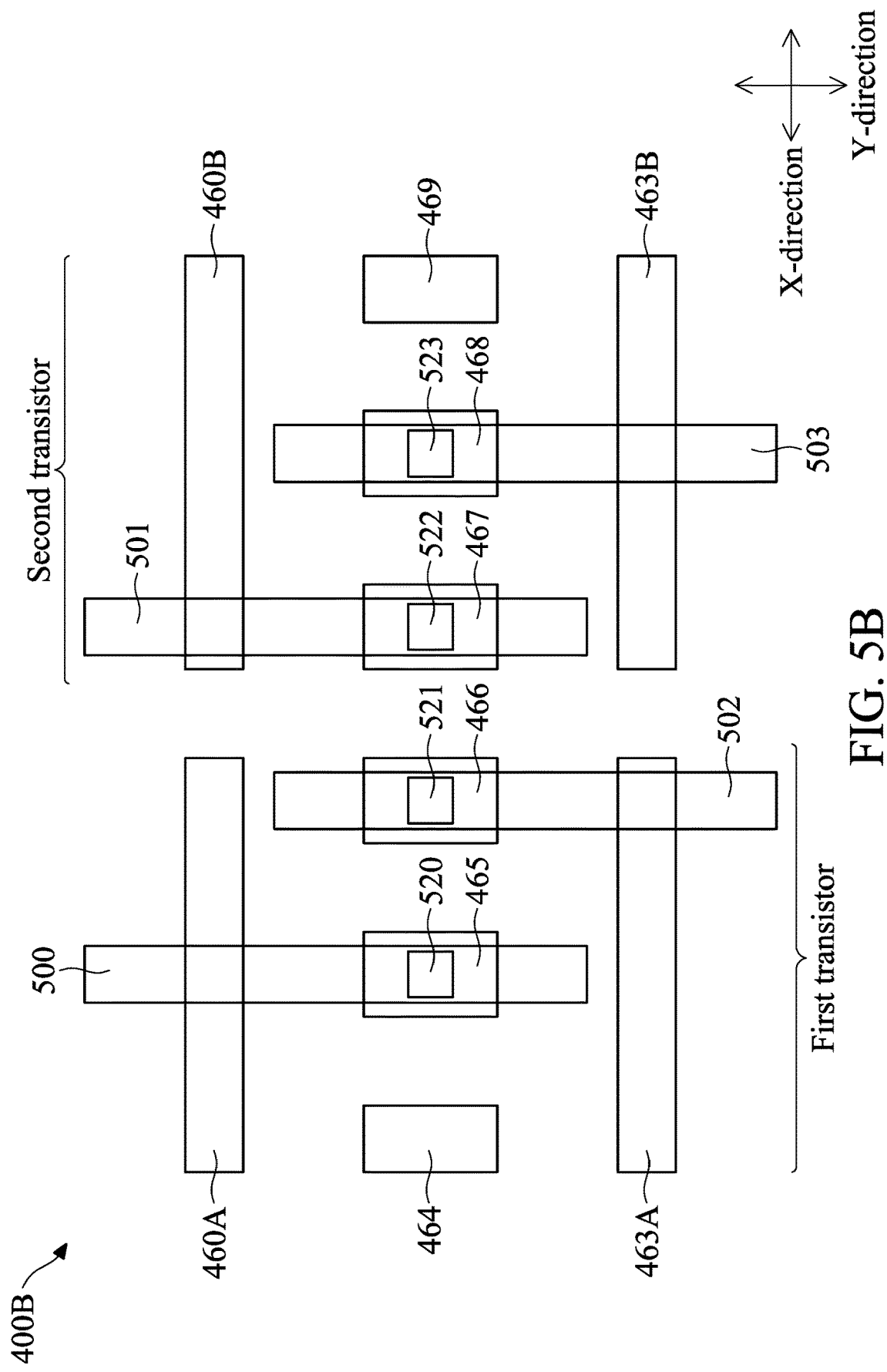
Figure 5C:
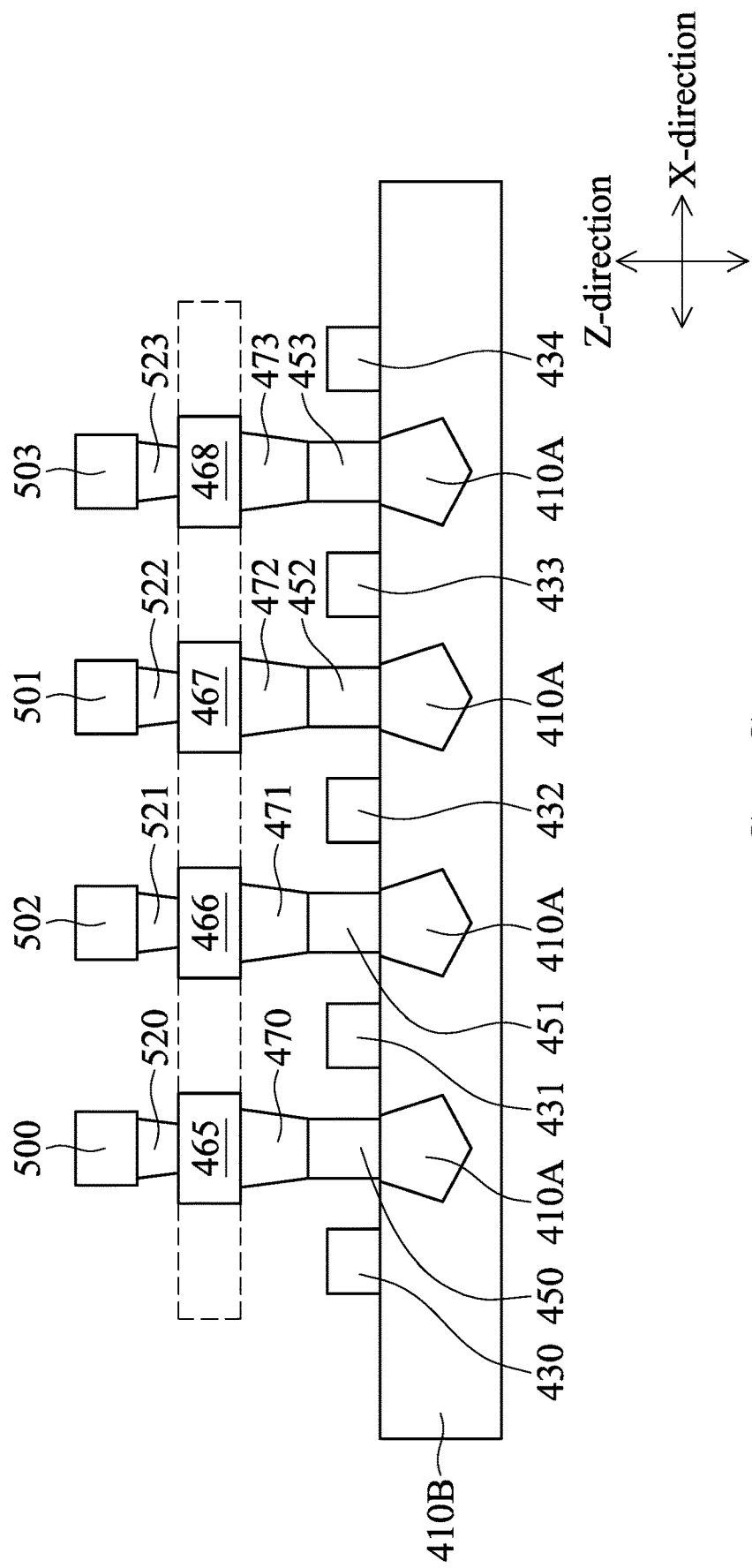

FIGS. 4A-4C illustrate an embodiment of the semiconductor device 400B as a single transistor. FIGS. 5A-5C illustrate another embodiment of the semiconductor device 400B as multiple transistors. For example, as shown in FIGS. 5A-5B, the metal line 460 is broken up into a metal line 460A and a metal line 460B, and the metal line 463 is broken up into a metal line 463A and a metal line 463B. This allows the source/drain regions for different transistors to be electrically isolated from one another, since the metal lines 460A and 460B (or the metal lines 463A and 463B) are no longer electrically tied to each other. A first transistor may include the gate structures 430-431 and the source/drain regions on either side of these gate structures 430-431. A second transistor may include the gate structures 433-434 and the source/drain regions on either side of these gate structures 433-434. It is understood that the multi-transistor embodiment of the semiconductor device 400B still offers the same benefits as the single-transistor embodiment of the semiconductor device 400B.

Figure 6A:
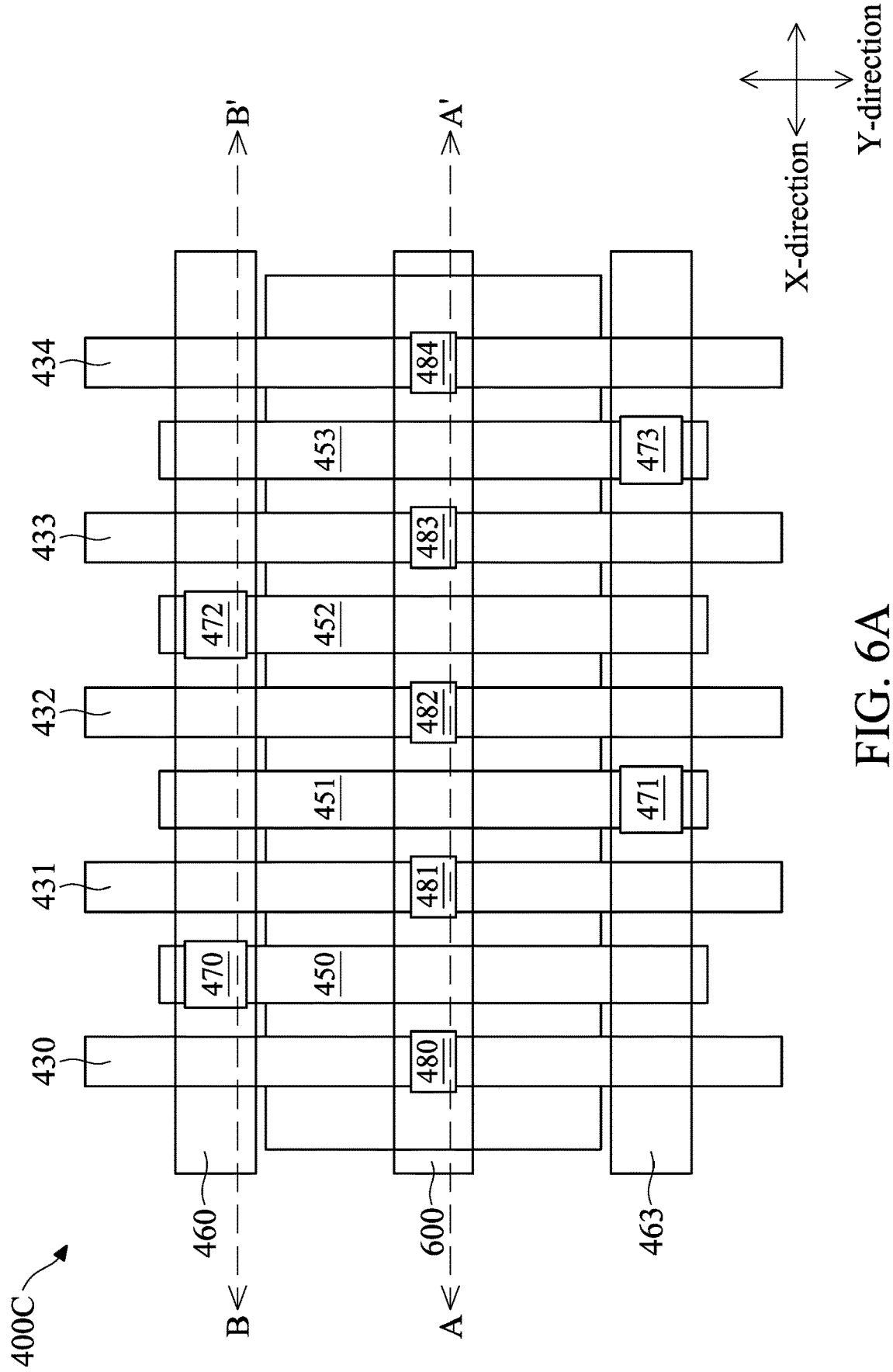
Figure 6B:
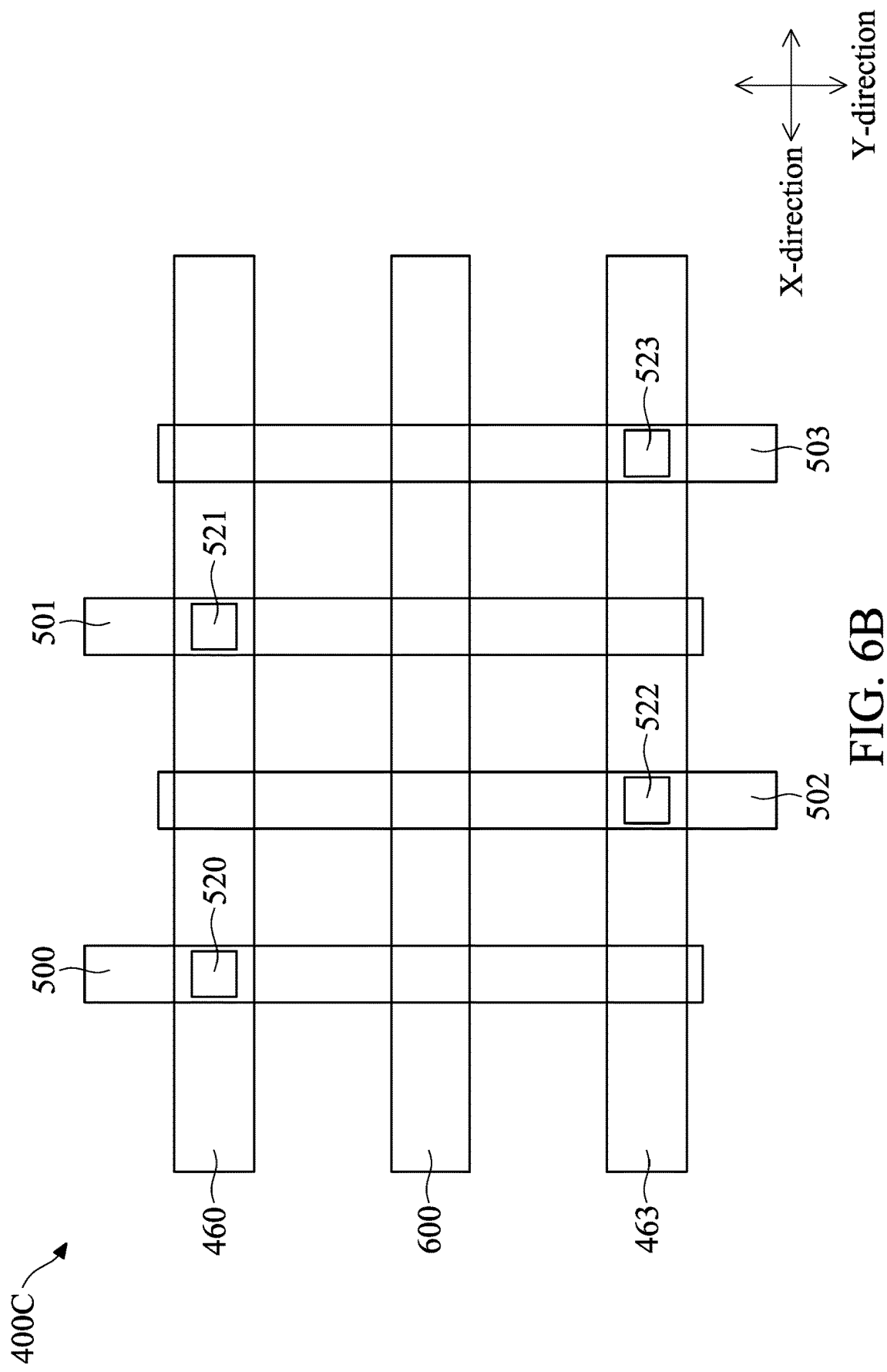
Figure 6C:
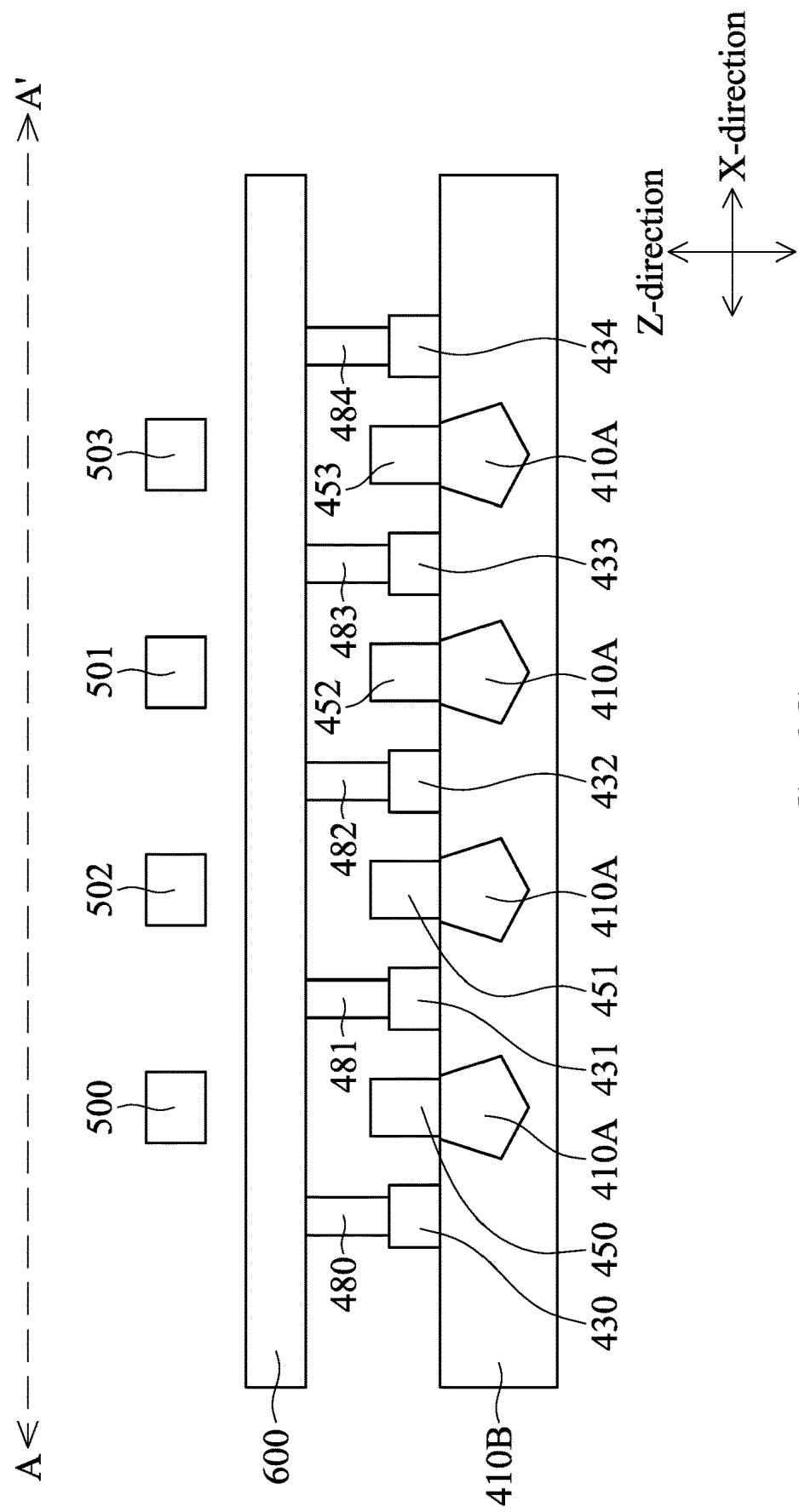
Figure 6D:
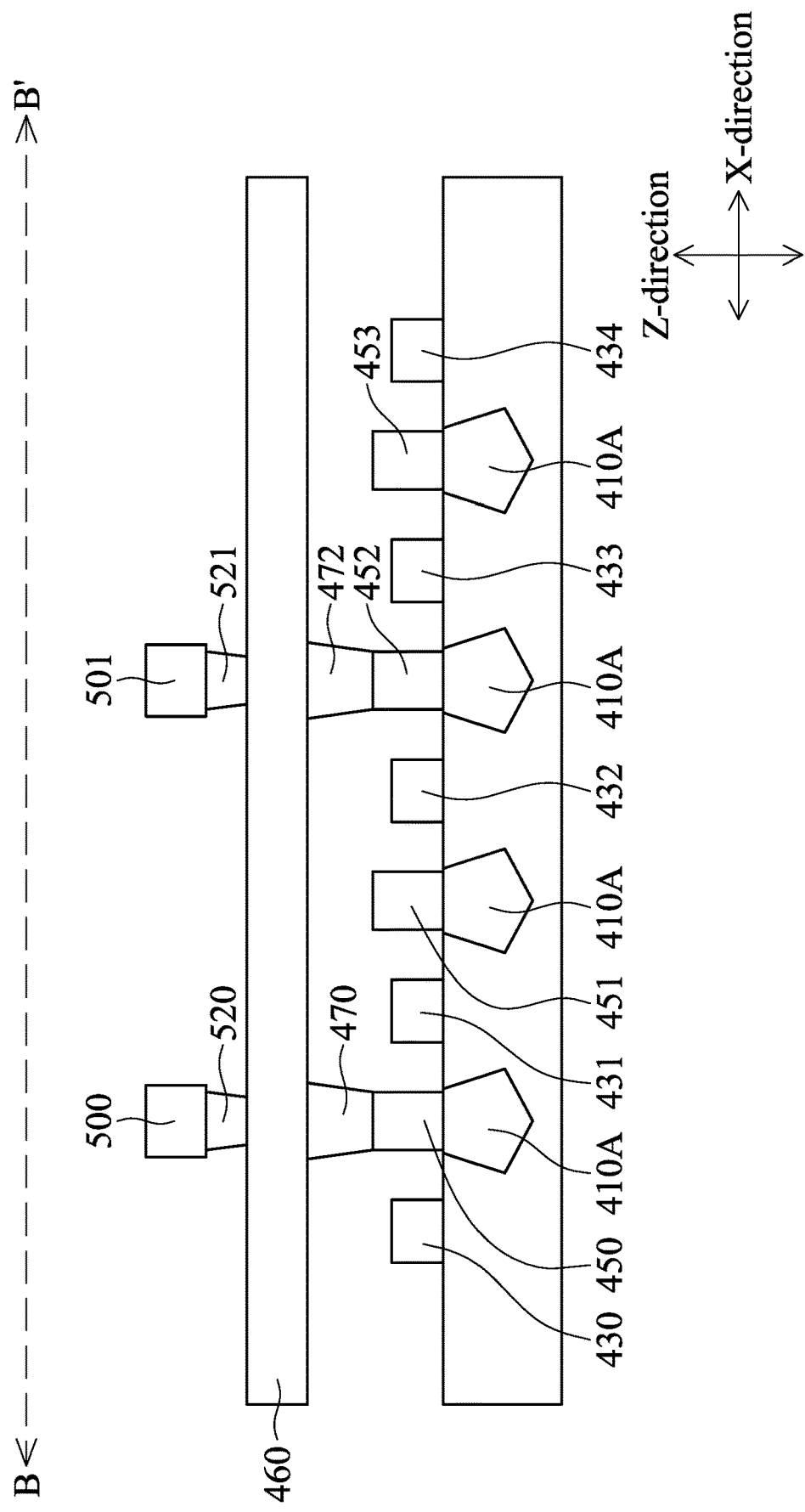
Figure 7A:
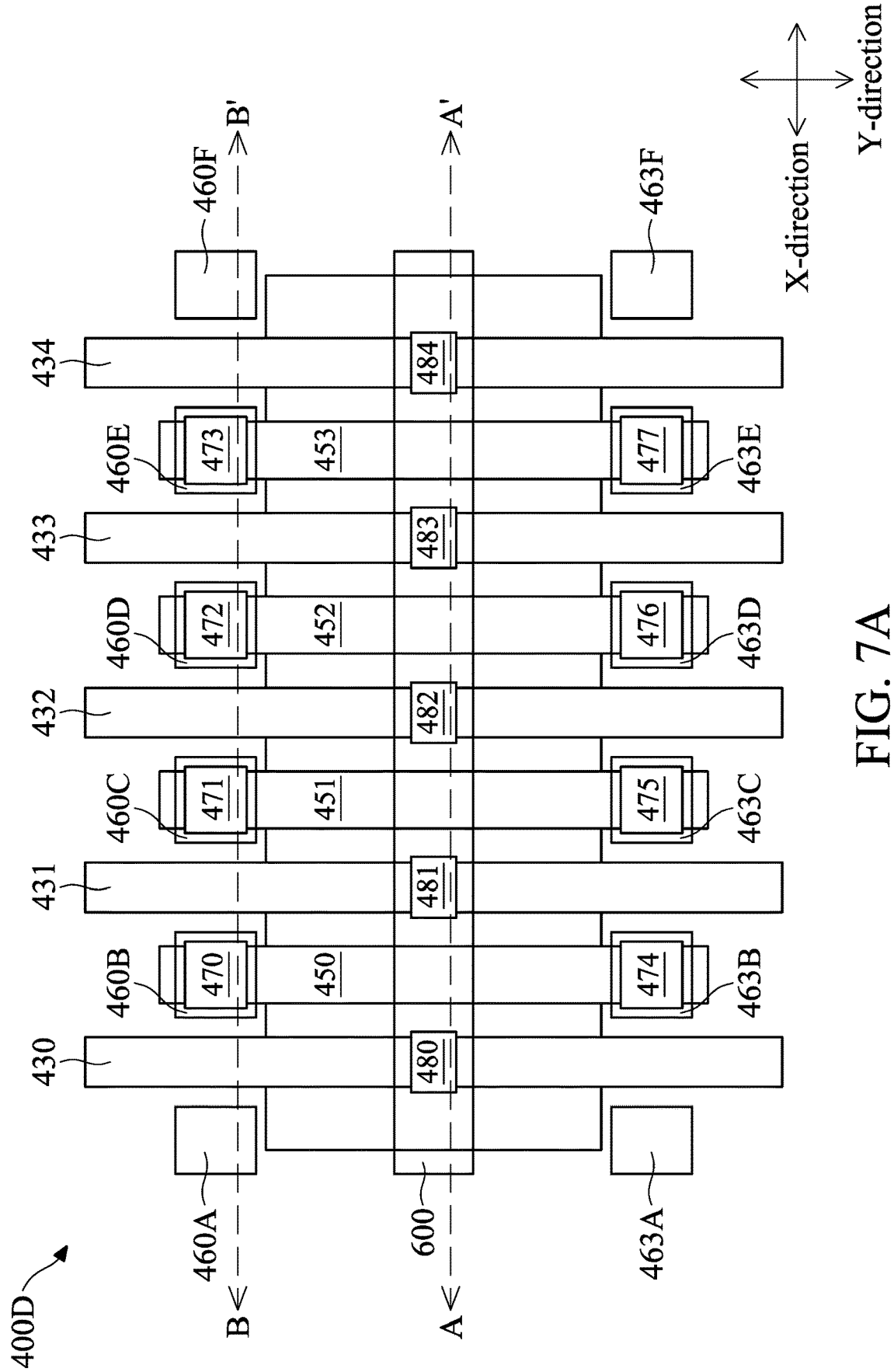
Figure 7B:
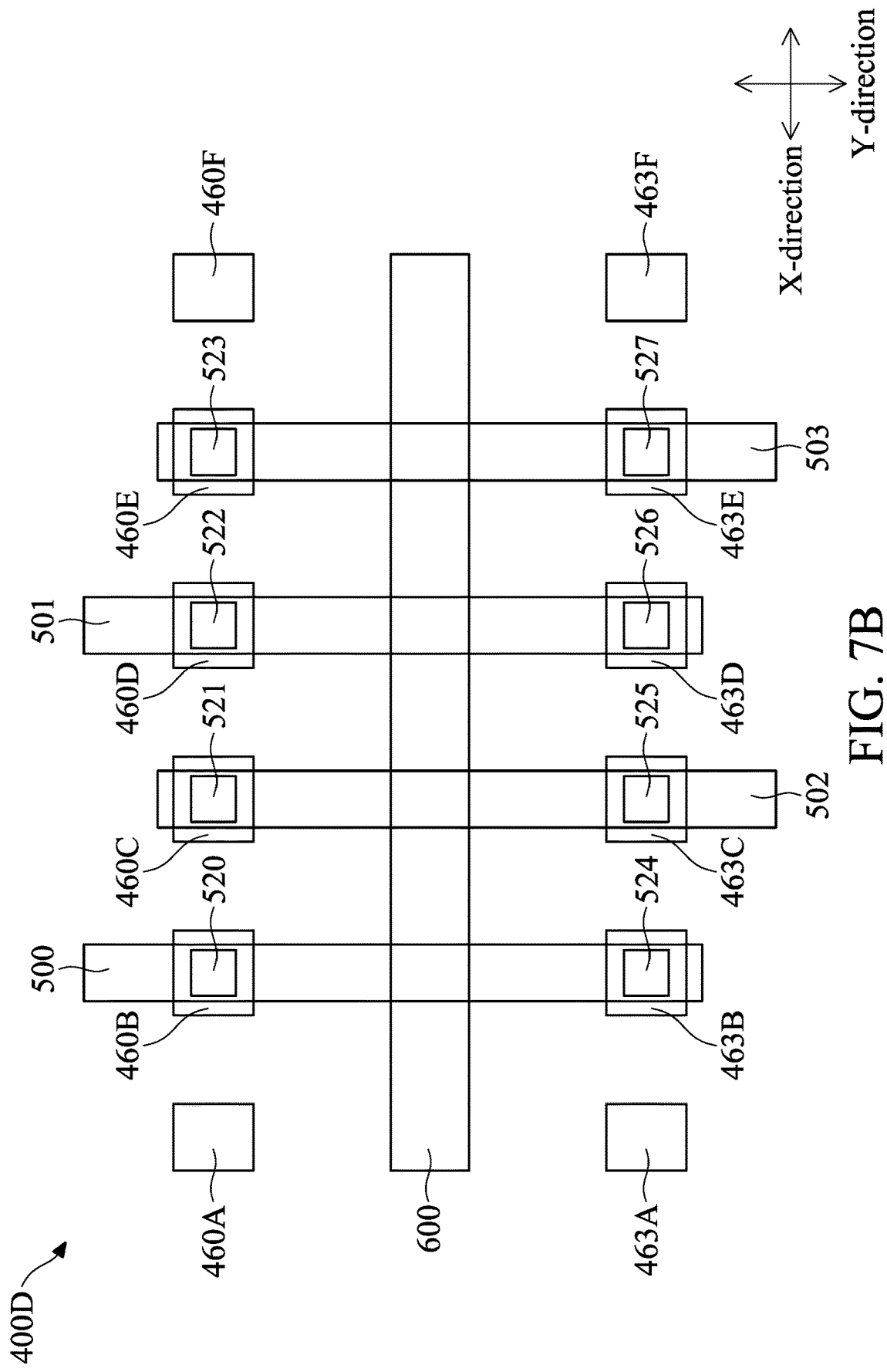
Figure 7C:
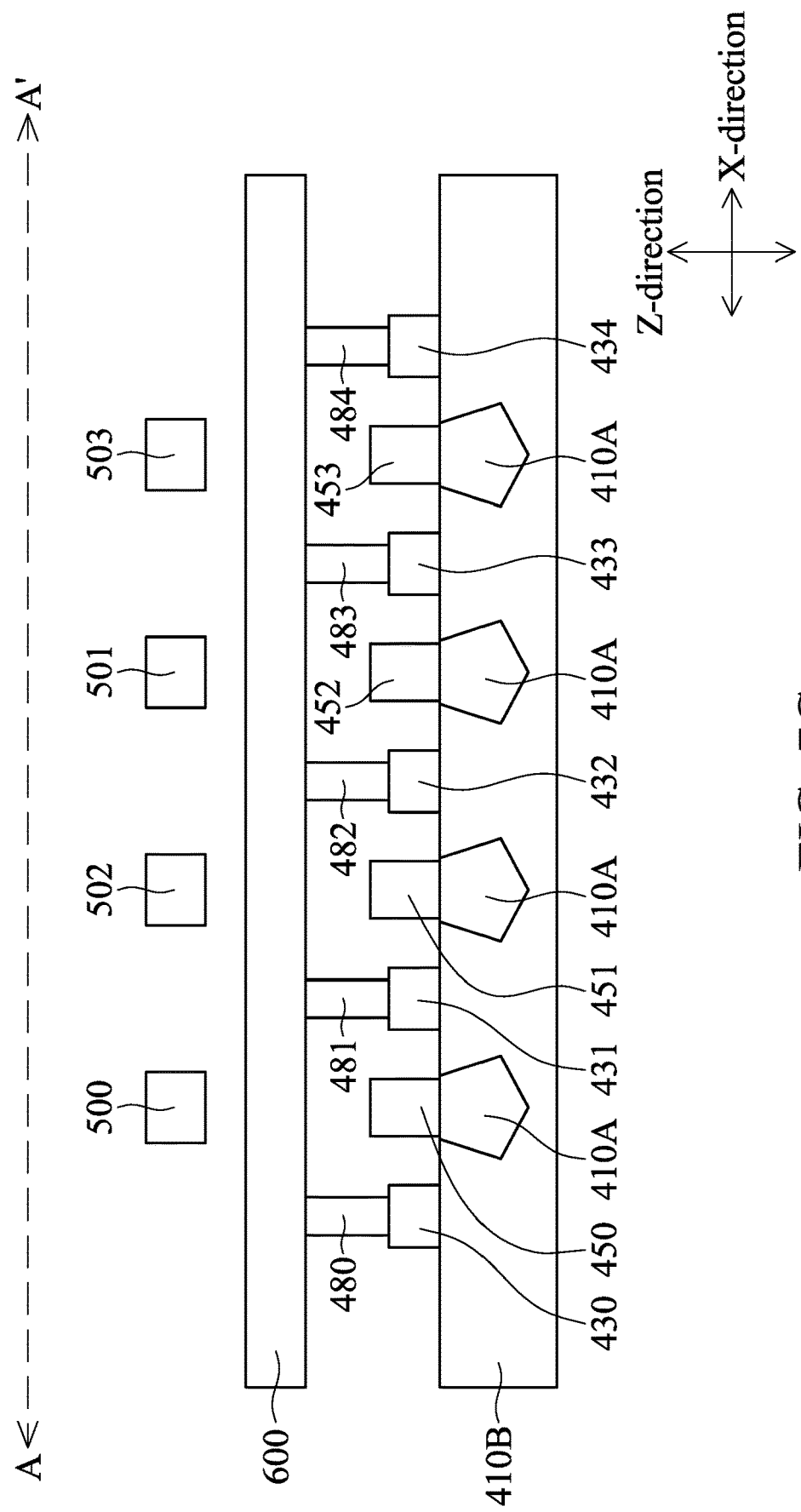
Figure 7D:
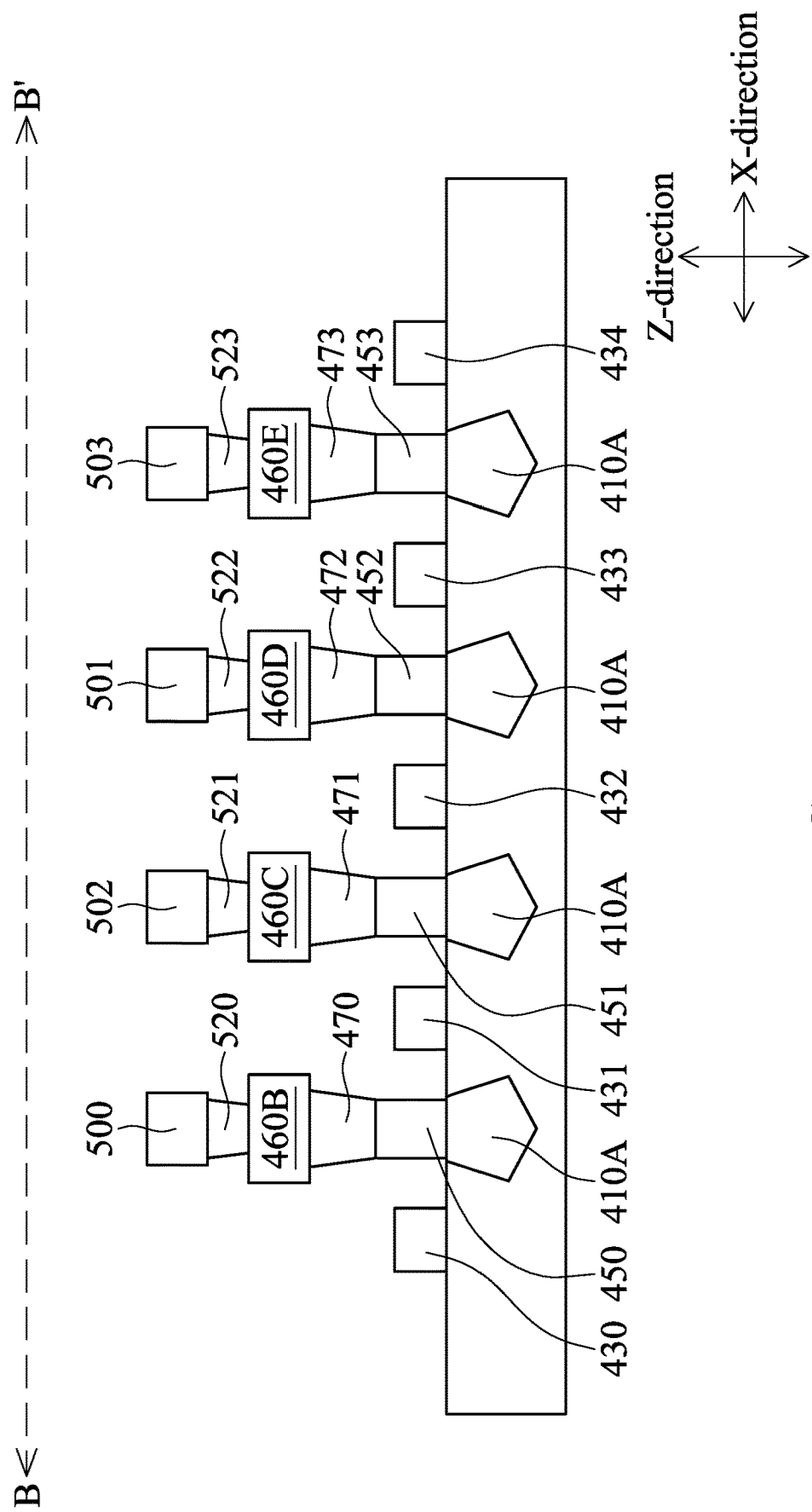

FIGS. 6A, 6B, 6C and 6D illustrate yet another embodiment of the present disclosure. In more detail, similar to FIGS. 3A-3B, FIGS. 6A-6B illustrate the top views of a semiconductor device 400C at different levels. And similar to FIG. 3C, FIG. 6C illustrates the cross-sectional side view of the semiconductor device 400C where the cross-section is taken along the cutline A-A', although the location of the cutline A-A' in FIG. 6A is different from the location of the cutline A-A' in FIG. 3A. Furthermore, FIG. 6D illustrates the cross-sectional side view of the semiconductor device 400C where the cross-section is taken along a cutline B-B'. For reasons of consistency and clarity, similar components appearing in FIGS. 3A-3C and FIGS. 6A-6D are labeled the same, and their details are not repeated herein. It is also understood that the device sizing of the semiconductor device 400C may be similar to that of the semiconductor device 400A (unless specifically described otherwise). As such, the semiconductor device 400C achieves similar benefits offered by the semiconductor device 400A, such as reduced parasitic resistance and/or parasitic capacitance, which in turn improves speed.

One difference between the semiconductor device 400A and the semiconductor device 400C is that the semiconductor device 400C does not have the metal lines 461-462 but instead implements a metal line 600 (which is still in the metal-0 layer) to provide electrical interconnections for the gate structures 430-434. For example, the two rows of gate contacts 480-484 and 485-489 in FIG. 3A are "consolidated" into a single row of gate contacts 480-484 in FIG. 6A. The gate contacts 480-484 are disposed between the metal line 600 and the gate structures 430-434, respectively, and therefore provide electrical connectivity to the gate structures 430-434. This is also visually illustrated in the cross-sectional view of FIG. 6C. By "centering" the gate contacts 480-484 from two rows into a single row between the metal lines 460 and 463, the gate structures 430-434 each have a direct connection to the metal line 600. This helps to reduce parasitic gate resistance, which minimizes a second pole effect on the bandwidth of the semiconductor device 400C.

The vias 470-473 have also been relocated in order to reduce electrical bridging (e.g., electrical shorting) risks with the gate contacts 480-484. This is achieved by lengthening the slot contacts 450-453 in the Y-direction. For example, in the semiconductor device 400A shown in FIG. 3A, the slot contacts 450-453 do not intersect or overlap with the metal lines 460 and 463 in the top view. However, in the semiconductor device 400C shown in FIG. 6A, the slot contacts 450-453 are long enough such that they intersect or overlap with the metal lines 460 and 463 in the top view. This makes it possible for the vias 470 and 472 to electrically interconnect the slot contacts 450 and 452 with the metal line 460, as well as for the vias 471 and 473 to electrically interconnect the slot contacts 451 and 453 with the metal line 463.

FIGS. 7A, 7B, 7C and 7D illustrate yet another embodiment of the present disclosure. In more detail, similar to FIGS. 6A-6B, FIGS. 7A-7B illustrate the top views of a semiconductor device 400D at different levels. And similar to FIGS. 6C-6D, FIGS. 7C-7D illustrate the cross-sectional side views of the semiconductor device 400D where the cross-section is taken along the cutlines A-A' and B-B', respectively. For reasons of consistency and clarity, similar components appearing in FIGS. 6A-6D and FIGS. 7A-7D are labeled the same, and their details are not repeated herein. It is also understood that the device sizing of the semiconductor device 400D may be similar to that of the semiconductor devices 400A or 400C (unless specifically described otherwise). As such, the semiconductor device 400D achieves similar benefits offered by the semiconductor devices 400A or 400C, such as reduced parasitic resistance and/or parasitic capacitance, which in turn improves speed.

For example, similar to the semiconductor device 400C, the gate contacts 480-484 have also been "centered" for the semiconductor device 400D. In addition, the semiconductor device 400D adds additional source/drain vias 470-477 for electrically interconnecting the source/drain regions. This is clearly shown in FIGS. 7A, 7B, and 7D, where each of the slot contacts 450-453 is electrically interconnected to two respective vias, whereas each slot contact is electrically interconnected to just one via in the previous embodiments. The implementation of additional vias helps to reduce the source/drain parasitic resistance, which in turns improves speed. It is also understood that additional vias 520-527 are also implemented between the metal-0 and metal-1 layers to correspond with the vias 470-477.

The semiconductor device 400D also breaks up the metal line 460 into a plurality of metal islands 460A-460F and the metal line 463 into a plurality of metal islands 463A-463F. This allows each of the metal islands 460A-460F or 463A-463F to be individually electrically coupled to a different source/drain region, through the vias 470-477.

Figure 8A:
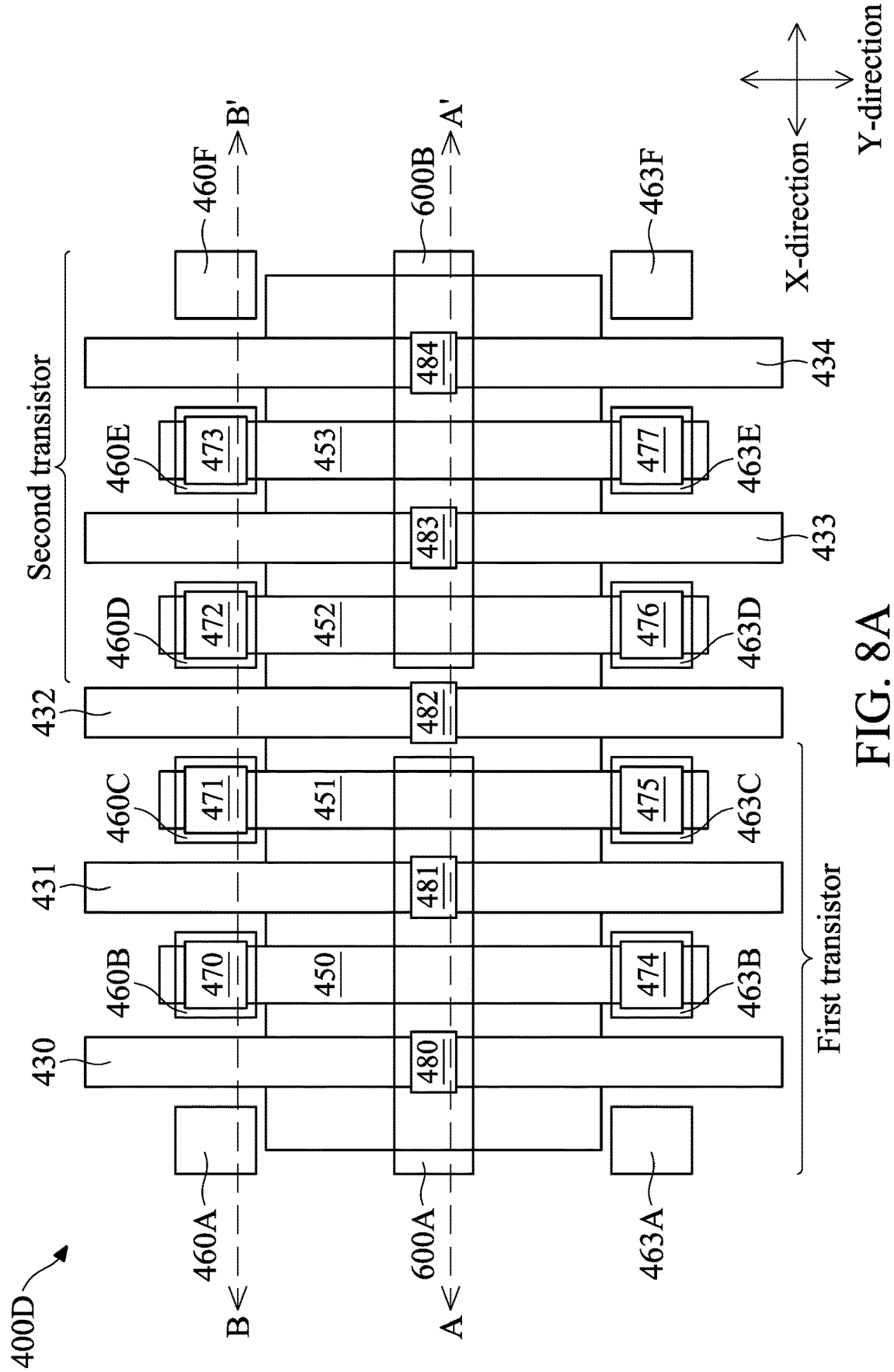
Figure 8B:
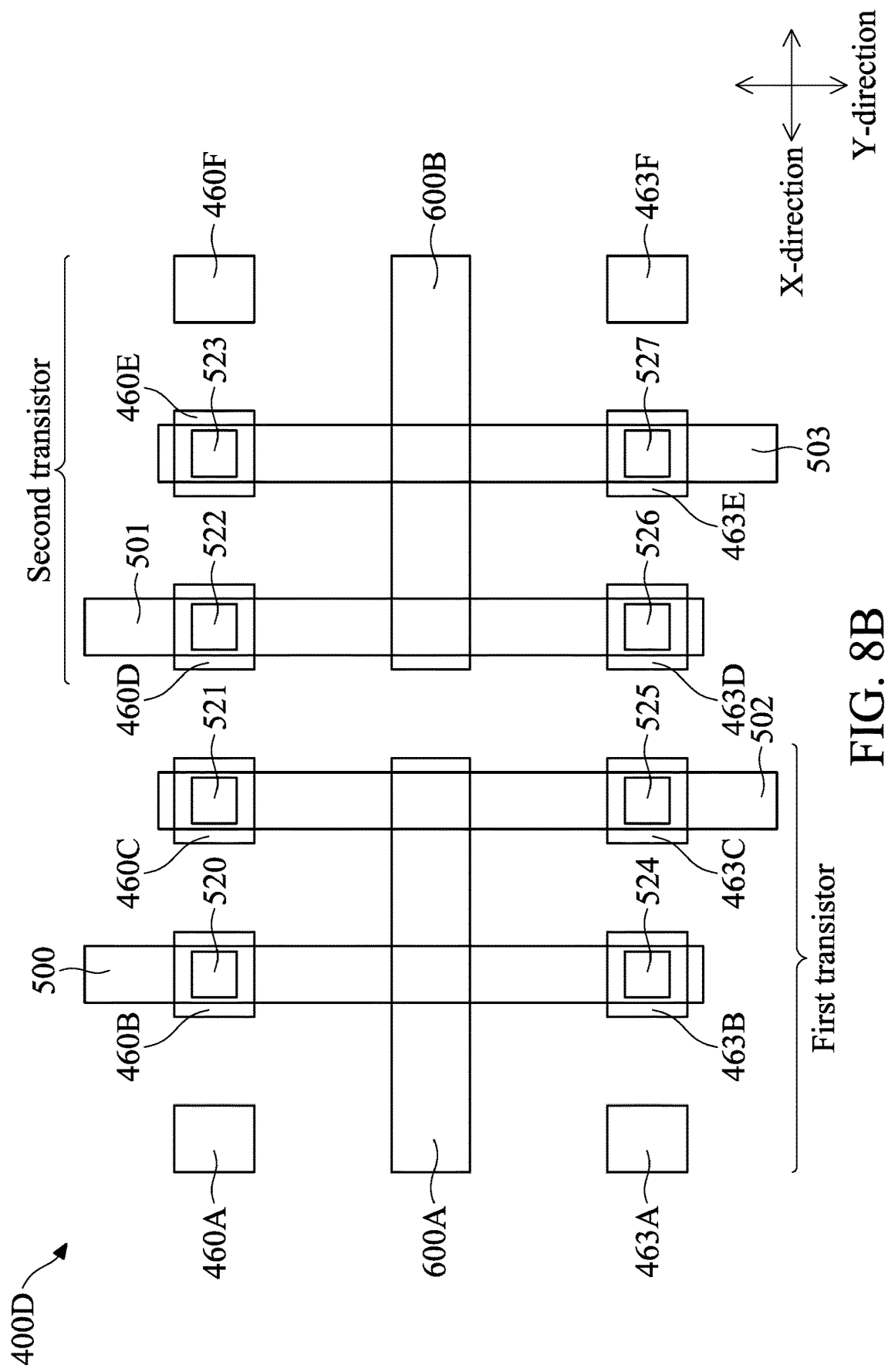
Figure 8C:
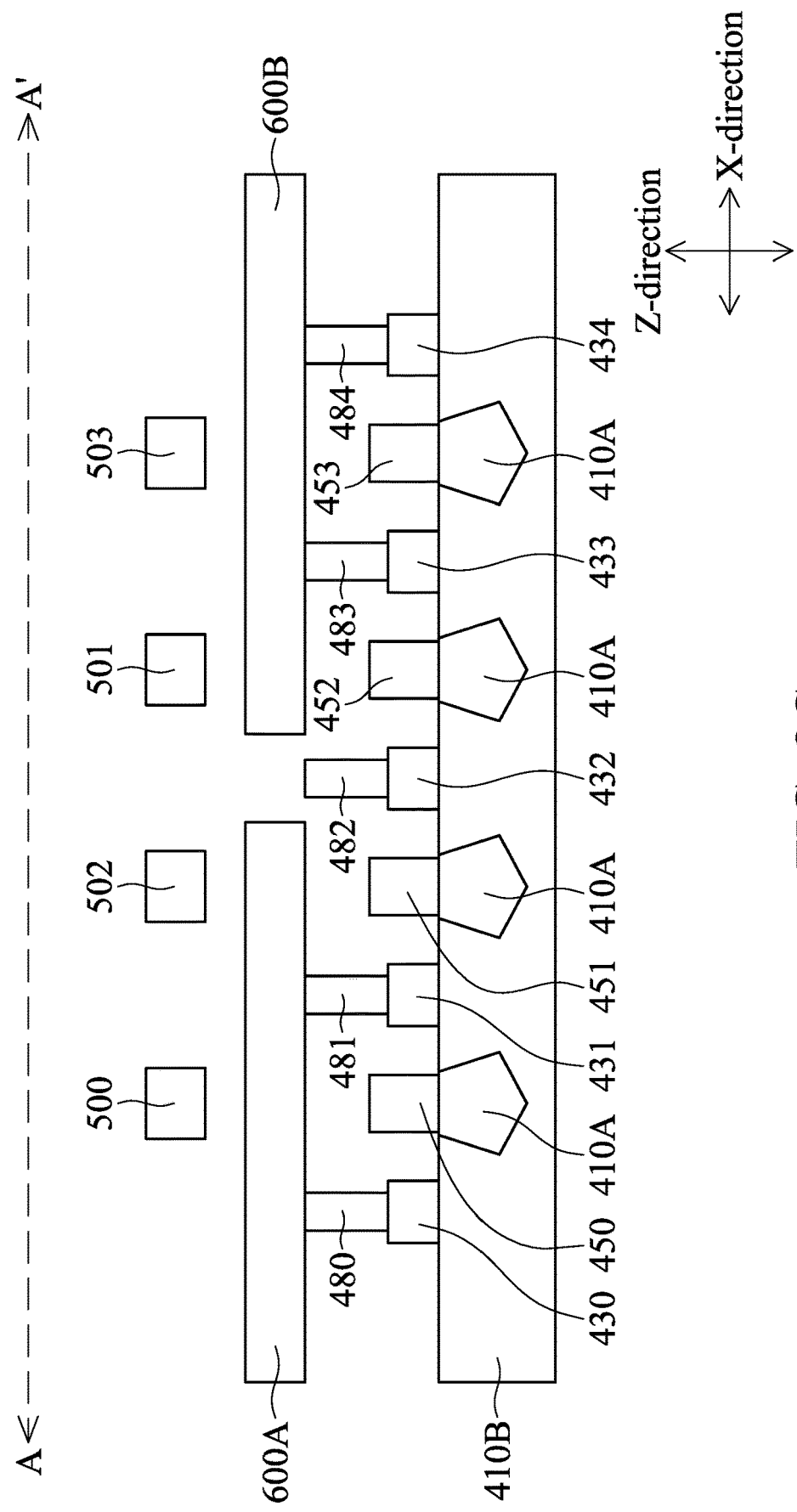
Figure 8D:
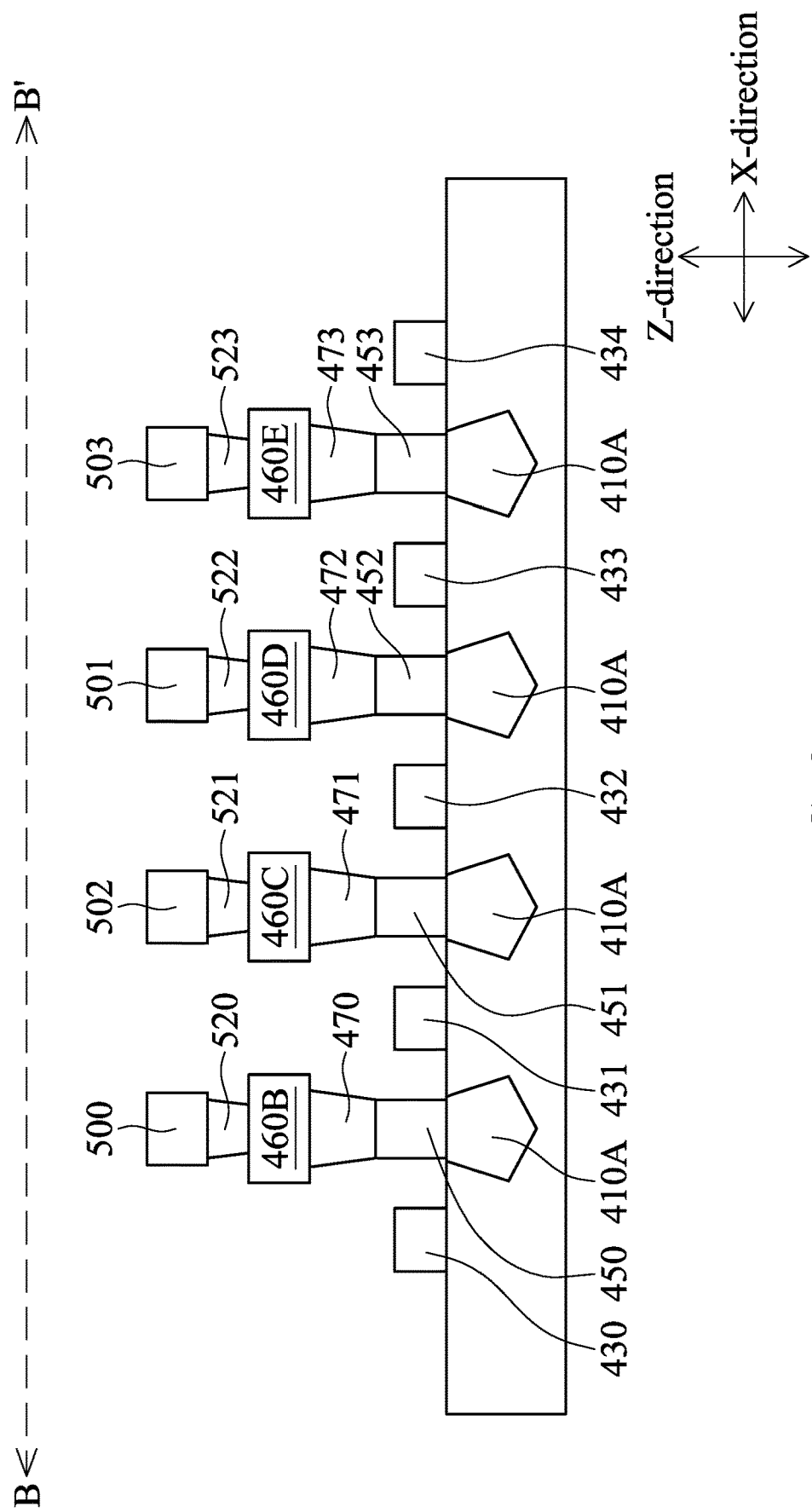

FIGS. 7A-7D illustrate an embodiment of the semiconductor device 400D as a single transistor. FIGS. 8A-8D illustrate another embodiment of the semiconductor device 400D as multiple transistors. For example, as shown in FIGS. 8A-8B, the metal line 600 is broken up into a metal line 600A and a metal line 600B. This allows the gate structures for different transistors to be electrically isolated from one another, since the metal lines 600A and 600B are no longer electrically tied to each other. A first transistor may include the gate structures 430-431 and the source/drain regions on either side of these gate structures 430-431. A second transistor may include the gate structures 433-434 and the source/drain regions on either side of these gate structures 433-434. It is understood that the multi-transistor embodiment of the semiconductor device 400D still offers at least the same benefits as the single-transistor embodiment of the semiconductor device 400D.

Figure 9:
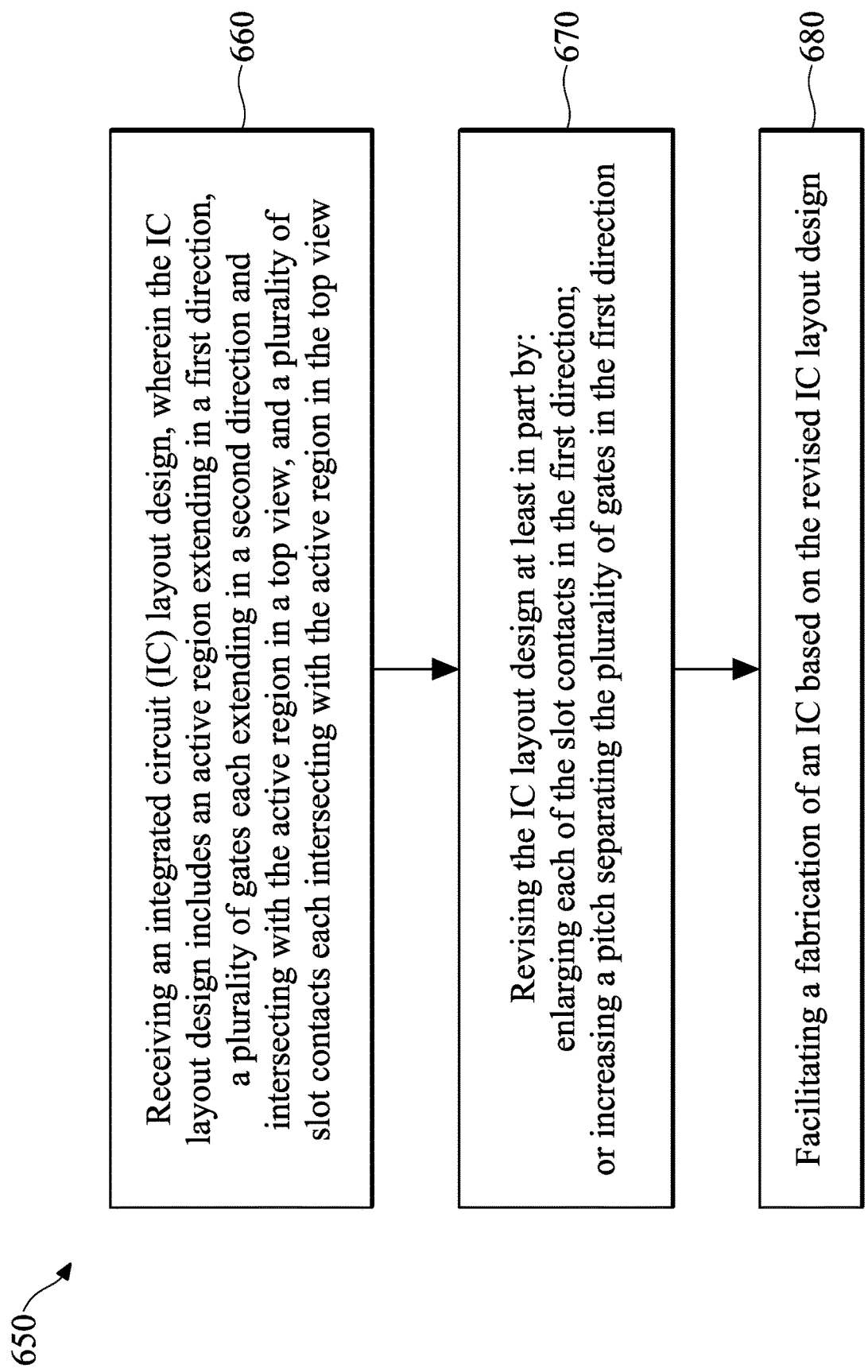
FIG. 9 illustrates a flowchart illustrating a method according to embodiments of the present disclosure.

FIG. 9 is a flowchart illustrating a method 650 according to an embodiment of the present disclosure. The method 650 includes a step 660 of receiving an integrated circuit (IC) layout design. The IC layout design includes an active region extending in a first direction, a plurality of gates each extending in a second direction and intersecting with the active region in a top view, and a plurality of slot contacts each intersecting with the active region in the top view.

The method 650 includes a step 670 of revising the IC layout design at least in part by: enlarging each of the slot contacts in the first direction; or increasing a pitch separating the plurality of gates in the first direction.

The method 650 includes a step 680 of facilitating a fabrication of an IC according to the revised IC layout design.

In some embodiments, the IC layout design is an IC layout design for a serializer/deserializer (SerDes) device or a radio frequency (RF) device.

In some embodiments, the revising the IC layout is performed without substantially affecting a dimension of each of the gates in the first direction.

In some embodiments, the IC layout design further includes a first metal line, a second metal line, a third metal line, and a fourth metal line that each extend in the first direction, the first metal line and the second metal line intersecting with the gates in the top view, and the third metal line and the fourth metal line intersecting with the slot contacts in the top view. The revising the IC layout design includes replacing the third metal line and the fourth metal line with a row of metal islands that are physically separated from each other in the first direction.

In some embodiments, the revising the IC layout further includes decreasing a distance separating the first metal line and the second metal line in the second direction.

In some embodiments, the IC layout design further includes a first metal line and a second metal line intersecting with the gates in the top view, a third metal line and a fourth metal line intersecting with the slot contacts in the top view, a plurality of first gate contacts disposed between the gates and the first metal line, and a plurality of second gate contacts disposed between the gates and the second metal line. The revising the IC layout design further includes: replacing the third metal line and the fourth metal line with a fifth metal line that is disposed between the first metal line and the second metal line in the top view; and replacing the first gate contacts and the second gate contacts with a plurality of third gate contacts that are disposed between the gates and the fifth metal line.

In some embodiments, the IC layout design further includes a first metal line and a second metal line intersecting with the gates in the top view, a third metal line and a fourth metal line intersecting with the slot contacts in the top view, a plurality of first source/drain vias disposed between the third metal line and a first subset of the slot contacts, and a plurality of second source/drain vias disposed between the fourth metal line and a second subset of the slot contacts. The revising the IC layout design further includes: replacing the first metal line with a first row of metal islands; replacing the second metal line with a second row of metal islands; replacing the first source/drain vias with a plurality of third source/drain vias that are disposed between the first row of metal islands and the slot contacts; and replacing the second source/drain vias with a plurality of fourth source/drain vias that are disposed between the second row of metal islands and the slot contacts.

In some embodiments, a number of the third source/drain vias is greater than a number of the first source/drain vias, and a number of the fourth source/drain vias is greater than a number of the third source/drain vias.

It is understood that additional processes may be performed before, during, or after the steps 660-680 of the method 650. For reasons of simplicity, these additional steps are not discussed herein in detail.

Figure 10:
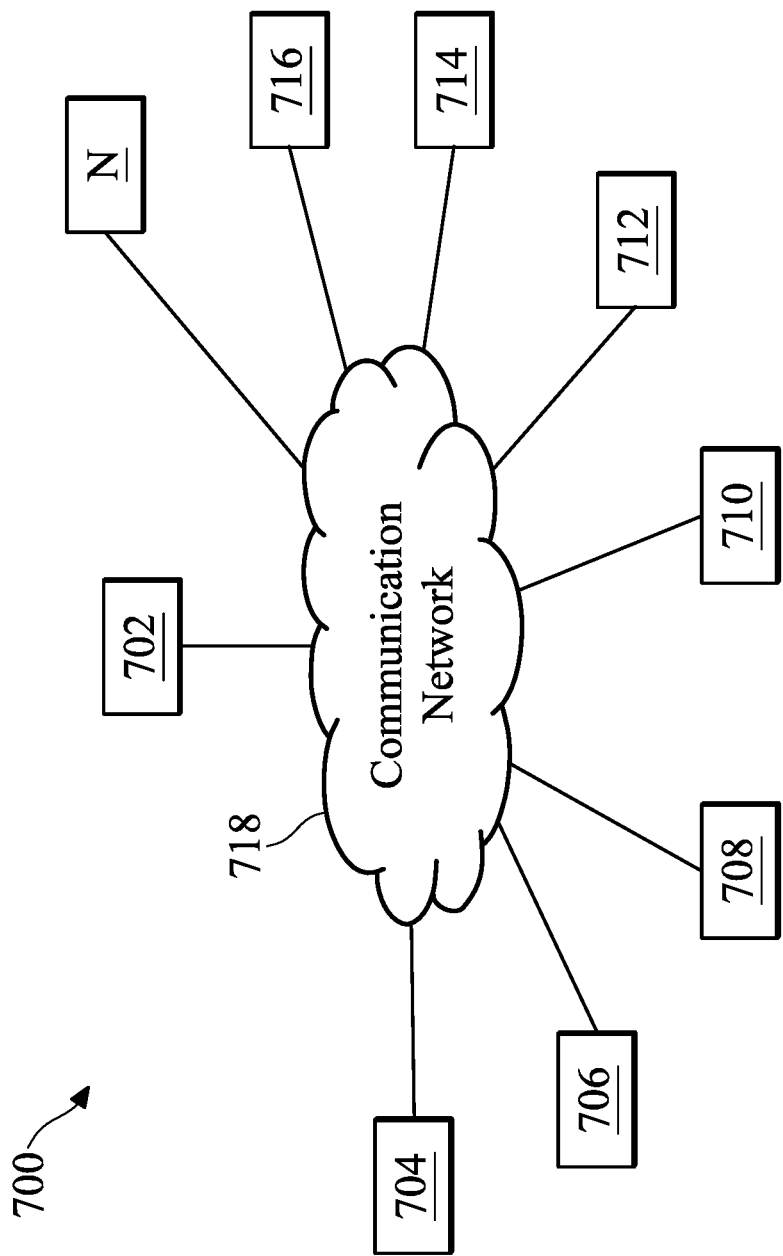
FIG. 10 illustrates a semiconductor fabrication facility according to embodiments of the present disclosure.

FIG. 10 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products; the entity 706 represents an engineer, such as a processing engineer to control process and the relevant recipes, or an equipment engineer to monitor or tune the conditions and setting of the processing tools; the entity 708 represents a metrology tool for IC testing and measurement; the entity 710 represents a semiconductor processing tool; the entity 712 represents a virtual metrology module associated with the processing tool 710; the entity 714 represents an advanced processing control module associated with the processing tool 710 and additionally other processing tools; and the entity 716 represents a sampling module associated with the processing tool 710.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks, such as the tasks associated with optimizing the CMP process controls as discussed above.

The integrated circuit fabrication system 700 enables interaction among the entities for the purpose of integrated circuit (IC) manufacturing, as well as advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The integrated circuit fabrication system 700 may be used to perform the method 650 discussed above with reference to FIG. 9. For example, one or more of the entities 702-716 may receive an IC layout design from a design house and thereafter revise the received IC layout design by resizing and/or moving the slot contacts, the gates, the source/drain vias, and the metal lines, as discussed above with reference to FIGS. 2, 3A-8A, 3B-8B, 3C-8C, and 6D-8D.

In summary, the present disclosure reconfigures the IC layout design for a non-logic device to reduce its parasitic capacitance and resistance. The non-logic device may include high speed devices such as serializer-deserializer devices or radio frequency devices. The reconfiguring the IC layout design may include increasing the gate pitch, enlarging slot contacts, centering source/drain vias, shortening distance between gate contacts, reducing active fin extension, centering gate contacts, replacing continuous metal lines with discontinuous metal islands, etc.

Based on the above discussions, it can be seen that the present disclosure offers advantages over conventional devices. It is understood, however, that other embodiments may offer additional advantages, and not all advantages are necessarily disclosed herein, and that no particular advantage is required for all embodiments. One advantage is improved device performance. As discussed above, conventional IC layout design is optimized for logic devices, but they do not take into account of the parasitic resistance or parasitic capacitance that may be caused by the conventional IC layout design. For high speed devices, parasitic resistance or capacitance could significantly degrade device performance such as speed. Here, by reconfiguring the IC layout design for certain non-logic devices, the parasitic resistance and/or capacitance are reduced, which improves device performance. Other advantages include compatibility with existing fabrication process flow and ease of implementation.

One aspect of the present disclosure pertains to a semiconductor device that includes a first type of device and a second type of device. The first type of device includes a first fin structure extending in a first direction, a first gate wrapping around the first fin structure, and a first slot contact disposed over the first fin structure. The first gate extends in a second direction and has a first gate dimension measured in the first direction. The first slot contact has a first slot contact dimension measured in the first direction. The second type of device includes: a second fin structure extending in a third direction, a second gate wrapping around the second fin structure, and a second slot contact disposed over the second fin structure. The second gate extends in a fourth direction and has a second gate dimension measured in the third direction. The second slot contact has a second slot contact dimension measured in the third direction. The second slot contact dimension is greater than the second gate dimension and greater than the first slot contact dimension.

Yet another aspect of the present disclosure pertains to a semiconductor device. The semiconductor device includes a logic device. The logic device includes a first active region extending in a first direction. The logic device includes a plurality of first gates that each intersect with the first active region in a top view. The first gates each extends in a second direction different from the first direction. Each pair of adjacent first gates define a first gate pitch. The logic device includes a plurality of first slot contacts disposed over the first active region. The first slot contacts each have a first slot contact width measured in the first direction. The semiconductor device also includes a non-logic device. The non-logic device includes a second active region extending in the first direction. The non-logic device includes a plurality of second gates that each intersect with the second active region in the top view. The second gates each extends in the second direction. Each pair of adjacent second gates define a second gate pitch substantially greater than the first gate pitch. The non-logic device includes a plurality of second slot contacts disposed over the second active region. The second slot contacts each have a second slot contact width measured in the first direction. The second slot contact width is substantially greater than the first slot contact width.

Yet another aspect of the present disclosure pertains to a method. An integrated circuit (IC) layout design is received. The IC layout design includes an active region extending in a first direction, a plurality of gates each extending in a second direction and intersecting with the active region in a top view, and a plurality of slot contacts each intersecting with the active region in the top view. The IC layout design is revised at least in part by: enlarging each of the slot contacts in the first direction; or increasing a pitch separating the plurality of gates in the first direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a first type of device, wherein the first type of device includes:
 a first fin structure extending in a first direction;
 a first gate that wraps around the first fin structure, wherein the first gate extends in a second direction different from the first direction and has a first gate dimension measured in the first direction in a top view; and
 a first slot contact disposed over the first fin structure, wherein the first slot contact has a first slot contact dimension measured in the first direction in the top view; and
a second type of device, wherein the second type of device includes:
 a second fin structure extending in a third direction;
 a second gate that wraps around the second fin structure, wherein the second gate extends in a fourth direction different from the third direction and has a second gate dimension measured in the third direction in the top view; and
 a second slot contact disposed over the second fin structure, wherein the second slot contact has a second slot contact dimension measured in the third direction in the top view, wherein the second slot contact dimension is greater than the second gate dimension and greater than the first slot contact dimension in the top view.

2. The semiconductor device of claim 1, wherein:
the first type of device includes a logic device;
the second type of device includes a non-logic device; and
the first type of device and the second type of device are fabricated on a same integrated circuit (IC) chip.

3. The semiconductor device of claim 1, wherein:
a first ratio exists between the first slot contact dimension and the first gate dimension;
a second ratio exists between the second slot contact dimension and the second gate dimension; and
the second ratio is greater than the first ratio.

4. The semiconductor device of claim 1, wherein:
the first type of device further includes a third gate that is separated from the first gate by a first gate pitch;
the second type of device further includes a fourth gate that is separated from the second gate by a second gate pitch; and
the second gate pitch is greater than the first gate pitch.

5. The semiconductor device of claim 1, wherein:
the first type of device further includes a first via disposed over the first slot contact, the first via having a first via dimension greater than the first slot contact dimension; and
the second type of device further includes a second via disposed over the second slot contact, the second via having a second via dimension smaller than the first slot contact dimension.

6. The semiconductor device of claim 1, wherein:
the first type of device further includes:
 a plurality of additional first slot contacts that are spaced apart from one another in the first direction; and
 one or more continuous first metal lines that each extends in the first direction and is electrically coupled to each of at least a subset of the first slot contacts;
the second type of device further includes:
 a plurality of additional second slot contacts that are spaced apart from one another in the third direction; and
 a plurality of metal islands that are each electrically coupled to a different one of the second slot contacts.

7. The semiconductor device of claim 1, wherein:
the first type of device further includes:
 a plurality of first gates that are spaced apart from one another in the first direction;
 a first metal line that extends in the first direction;
 a second metal line that extends in the first direction;
 a first subset of a plurality of first gate contacts that are disposed between the first gates and the first metal line; and
 a second subset of the plurality of first gate contacts that are disposed between the first gates and the second metal line; and
the second type of device further includes:
 a plurality of second gates that are spaced apart from one another in the third direction;
 a third metal line that extends in the third direction;
 a fourth metal line that extends in the third direction;
 a fifth metal line that extends in the third direction, the fifth metal line being disposed between the third metal line and the fourth metal line in a top view; and
 a plurality of second gate contacts that are disposed between the second gates and the fifth metal line.

8. The semiconductor device of claim 1, wherein:
the first type of device further includes:
 a plurality of additional first slot contacts that are spaced apart from one another in the first direction;
 a first metal line that extends in the first direction;
 a second metal line that extends in the first direction;
 a first subset of a plurality of first source/drain vias disposed between the first metal line and a first subset of the first slot contacts; and
 a second subset of the plurality of first source/drain vias disposed between the second metal line and a second subset of the first slot contacts; and
the second type of device further includes:
 a plurality of additional second slot contacts that are spaced apart from one another in the third direction;
 a plurality of first metal islands that are arranged as a first row extending in the third direction;
 a plurality of second metal islands that are arranged as a second row extending in the third direction;
 a first subset of a plurality of second source/drain vias disposed between the first metal islands and the second slot contacts; and
 a second subset of the plurality of second source/drain vias disposed between the second metal islands and the second slot contacts.

9. The semiconductor device of claim 8, wherein a number of the second source/drain vias is greater than a number of the first source/drain vias.

10. A semiconductor device, comprising:
a logic device that comprises NOR gates, NAND gates, XOR gates, or inverter gates, wherein the logic device includes:
   a first active region extending in a first direction;
   a plurality of first gates that each intersect with the first active region in a top view, wherein the first gates each extends in a second direction different from the first direction, and wherein each pair of adjacent first gates define a first gate pitch; and
   a plurality of first slot contacts disposed over the first active region, wherein the first slot contacts each have a first slot contact width measured in the first direction; and
a non-logic device that comprises a high speed device operating at a speed greater than a predefined speed, wherein the non-logic device includes:
   a second active region extending in the first direction;
   a plurality of second gates that each intersect with the second active region in the top view, wherein the second gates each extends in the second direction, and wherein each pair of adjacent second gates define a second gate pitch substantially greater than the first gate pitch; and
   a plurality of second slot contacts disposed over the second active region, wherein the second slot contacts each have a second slot contact width measured in the first direction, wherein the second slot contact width is substantially greater than the first slot contact width, and wherein the second slot contact width is substantially greater than the first slot contact width in at least a top view.

11. The semiconductor device of claim 10, wherein:
the first gates each have a first gate width measured in the first direction;
the second gates each have a second gate width measured in the first direction; and
the first gate width is substantially equal to the second gate width.

12. The semiconductor device of claim 10, wherein the logic device and the non-logic device are implemented on a same Integrated Circuit (IC) chip.

13. The semiconductor device of claim 10, wherein:
the logic device further includes a first via disposed over at least one of the first slot contacts, the first via having a first via width measured in the first direction, wherein the first via width is greater than the first slot contact width; and
the non-logic device further includes a second via disposed over at least one of the second slot contacts, the second via having a second via width measured in the first direction, wherein the second via width is less than the second slot contact width.

14. The semiconductor device of claim 10, wherein the non-logic device operates at a speed greater than 10 gigabits per second.

15. The semiconductor device of claim 10, wherein:
the logic device further includes a continuous metal line that is electrically coupled to two or more of the first slot contacts; and
the non-logic device further includes a plurality of metal islands that are separated from one another, wherein each of the metal islands is electrically coupled to a respective one of the second slot contacts.

16. The semiconductor device of claim 10, wherein a ratio of the second gate pitch and the first gate pitch is in a range between about 1.1:1 and about 2:1.

17. The semiconductor device of claim 10, wherein a ratio of the second slot contact width and the first slot contact width is in a range between about 1.5:1 and about 3:1.

18. A semiconductor device, comprising:
a first type of device, wherein the first type of device includes:
   a first active region extending in a first direction;
   a plurality of first gates that each wrap around the first active region, wherein the first gates each extend in a second direction different from the first direction, and wherein each of the first gates has a first gate dimension measured in the first direction; and
   a plurality of first slot contacts disposed over the first active region, wherein each of the first slot contacts is disposed between two respective first gates, and wherein the first slot contacts each have a first slot contact dimension measured in the first direction; and
a second type of device, wherein the second type of device includes:
   a second active region extending in the first direction;
   a plurality of second gates that each wrap around the second active region, wherein the second gates each extend in the second direction, and wherein each of the second gates has a second gate dimension measured in the first direction; and
   a plurality of second slot contacts disposed over the second active region, wherein each of the second slot contacts is disposed between two respective second gates, and wherein the second slot contacts each have a second slot contact dimension measured in the first direction;
wherein:
the first type of device and the second type of device are implemented on a same Integrated Circuit (IC) chip;
the first gate dimension is substantially equal to the second gate dimension in a top view; and
the first slot contact dimension is substantially smaller than the second slot contact dimension in the top view.

19. The semiconductor device of claim 18, wherein:
the first gates have a first gate pitch;
the second gates have a second gate pitch; and
the second gate pitch is substantially greater than the first gate pitch.

20. The semiconductor device of claim 18, wherein the second type of device has a higher speed than the first type of device, and wherein the second type of device, but not the first type of device, includes a serializer/deserializer device or a radio frequency (RF) device.

* * * * *